(12) United States Patent
Ishihara et al.

(10) Patent No.: US 9,277,650 B2
(45) Date of Patent: Mar. 1, 2016

(54) COMBINED WIRING BOARD AND METHOD FOR MANUFACTURING THE SAME

(71) Applicant: IBIDEN CO., LTD., Ogaki-shi (JP)

(72) Inventors: Teruyuki Ishihara, Ogaki (JP); Michimasa Takahashi, Ogaki (JP)

(73) Assignee: IBIDEN CO., LTD., Ogaki-shi (JP)

(*) Notice: Subject to any disclaimer, the term of this patent is extended or adjusted under 35 U.S.C. 154(b) by 0 days.

(21) Appl. No.: 14/542,753

(22) Filed: Nov. 17, 2014

(65) Prior Publication Data

US 2015/0136454 A1 May 21, 2015

(30) Foreign Application Priority Data

Nov. 15, 2013 (JP) ................................. 2013-236517

(51) Int. Cl.
| H05K 1/11 | (2006.01) |
| H05K 1/14 | (2006.01) |
| H05K 1/02 | (2006.01) |
| H05K 3/36 | (2006.01) |
| H05K 3/00 | (2006.01) |

(52) U.S. Cl.
CPC .............. *H05K 1/142* (2013.01); *H05K 1/0271* (2013.01); *H05K 1/144* (2013.01); *H05K 3/0097* (2013.01); *H05K 3/368* (2013.01); *H05K 1/0228* (2013.01); *H05K 3/0052* (2013.01); *H05K 2201/068* (2013.01); *H05K 2201/2018* (2013.01); *H05K 2201/2072* (2013.01); *H05K 2203/0169* (2013.01); *Y10T 29/49126* (2015.01)

(58) Field of Classification Search
USPC .......................... 361/792, 784; 174/255, 250
See application file for complete search history.

(56) References Cited

U.S. PATENT DOCUMENTS

| 8,259,467 B2 * | 9/2012 | Hasegawa ............ H05K 3/0052 361/792 |
| 2014/0345664 A1 * | 11/2014 | Meyer .................. C04B 37/021 136/205 |

FOREIGN PATENT DOCUMENTS

JP 2011-023657 A 2/2011

OTHER PUBLICATIONS

U.S. Appl. No. 14/542,721, filed Nov. 14, 2014, Ishihara, et al.
U.S. Appl. No. 14/496,028, filed Sep. 25, 2014, Ishihara, et al.
U.S. Appl. No. 14/492,424, filed Sep. 22, 2014, Ishihara, et al.

* cited by examiner

*Primary Examiner* — Andargie M Aychillhum
(74) *Attorney, Agent, or Firm* — Oblon, McClelland, Maier & Neustadt, L.L.P.

(57) ABSTRACT

A combined wiring board includes multiple wiring boards, and a connected metal frame having multiple metal frames and one or more connecting portions such that the metal frames are connected each other by the connecting portion or connecting portions and have accommodation opening portions formed to accommodate the wiring boards, respectively.

14 Claims, 23 Drawing Sheets

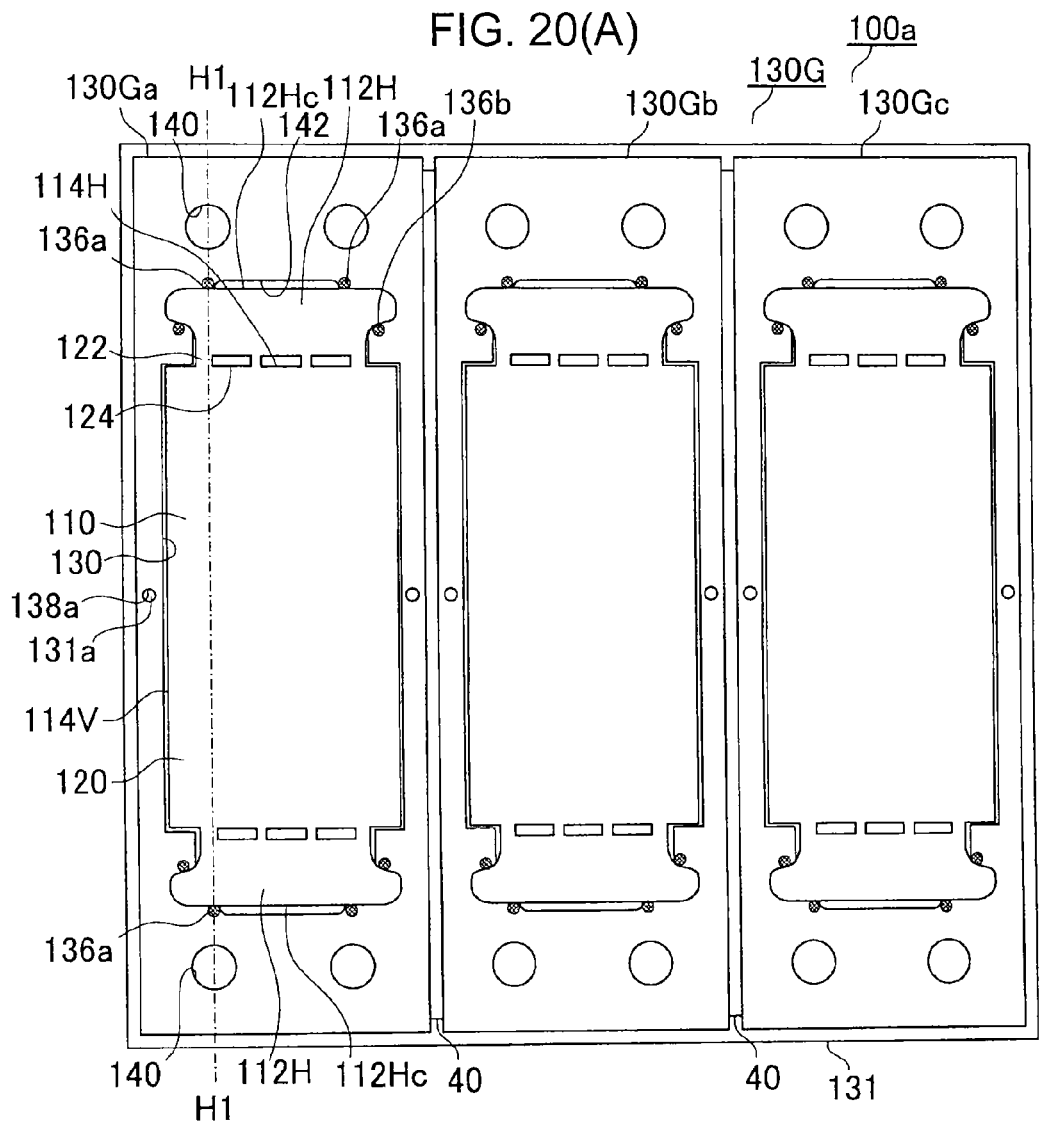
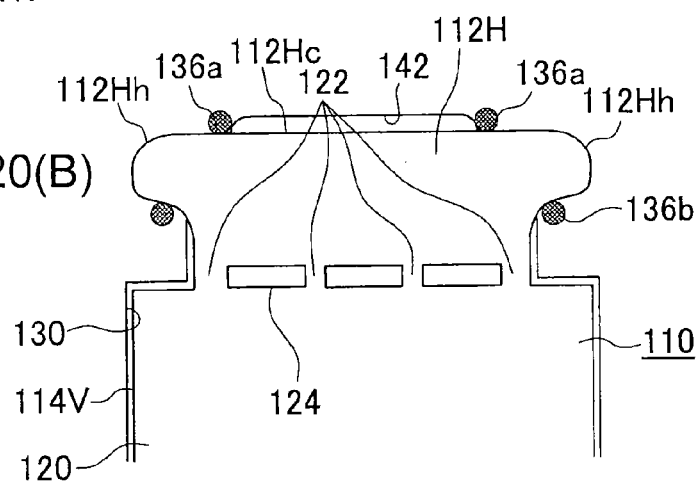

US 9,277,650 B2

COMBINED WIRING BOARD AND METHOD FOR MANUFACTURING THE SAME

CROSS-REFERENCE TO RELATED APPLICATIONS

The present application is based upon and claims the benefit of priority to Japanese Patent Application No. 2013-236517, filed Nov. 15, 2013, the entire contents of which are incorporated herein by reference.

BACKGROUND OF THE INVENTION

1. Field of the Invention

The present invention relates to a combined wiring board where multiple wiring boards to be reflowed are fixed to a metal frame.

2. Description of Background Art

When mounting an electronic component on a wiring board and conducting other procedures on the wiring board, such procedures may be performed not on one single wiring board but on a combined wiring board where multiple identical wiring boards are accommodated in a wiring-board accommodation kit. JP2011-23657A describes a multipiece wiring-board accommodation kit made up of multiple piece wiring boards and a frame having accommodation holes to accommodate the piece wiring boards. The entire contents of this publication are incorporated herein by reference.

SUMMARY OF THE INVENTION

According to one aspect of the present invention, a combined wiring board includes multiple wiring boards, and a connected metal frame having multiple metal frames and one or more connecting portions such that the metal frames are connected each other by the connecting portion or connecting portions and have accommodation opening portions formed to accommodate the wiring boards, respectively.

According to another aspect of the present invention, a method for manufacturing a combined wiring board includes preparing multiple metal frames having accommodation opening portions, respectively, accommodating wiring boards in the accommodation opening portions formed in the metal frames, respectively, such that each of the wiring boards is positioned in each of the accommodation opening portions of the metal frames, and forming one or more connecting portions between the metal frames such that a connected metal frame including the metal frames connected each other by the connecting portion or connecting portions is formed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 20(A) is a plan view of a combined wiring board according to a second embodiment;

FIG. 20(B) is a plan view of a support piece of a printed wiring board;

DETAILED DESCRIPTION OF THE EMBODIMENTS

Figure 1:
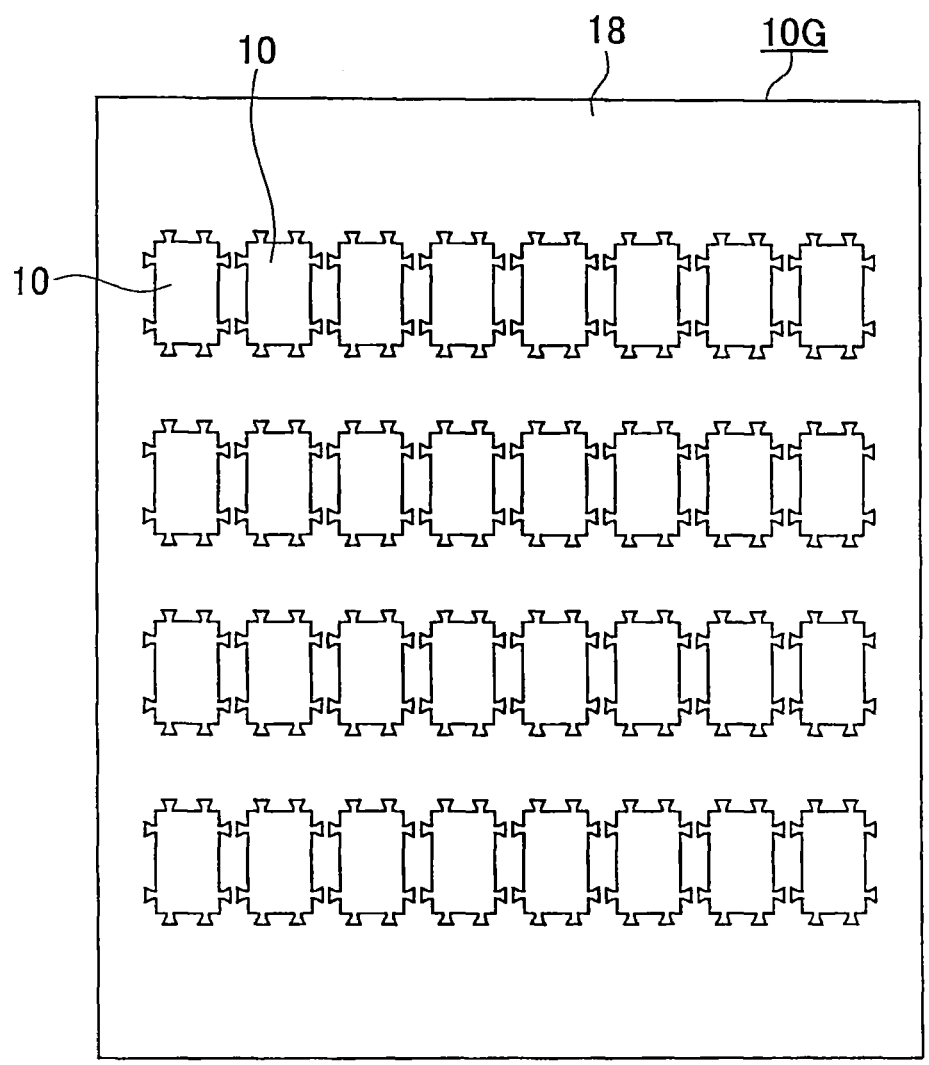
FIG. 1 is a plan view of a multipiece printed wiring board.

The embodiments will now be described with reference to the accompanying drawings, wherein like reference numerals designate corresponding or identical elements throughout the various drawings.

First Embodiment

In combined wiring board 100 according to the present embodiment, multiple wiring boards to be reflowed are fixed to connected metal frame (30G) so that warping will not occur in the wiring boards during the reflow process for mounting electronic components.

Figure 12:
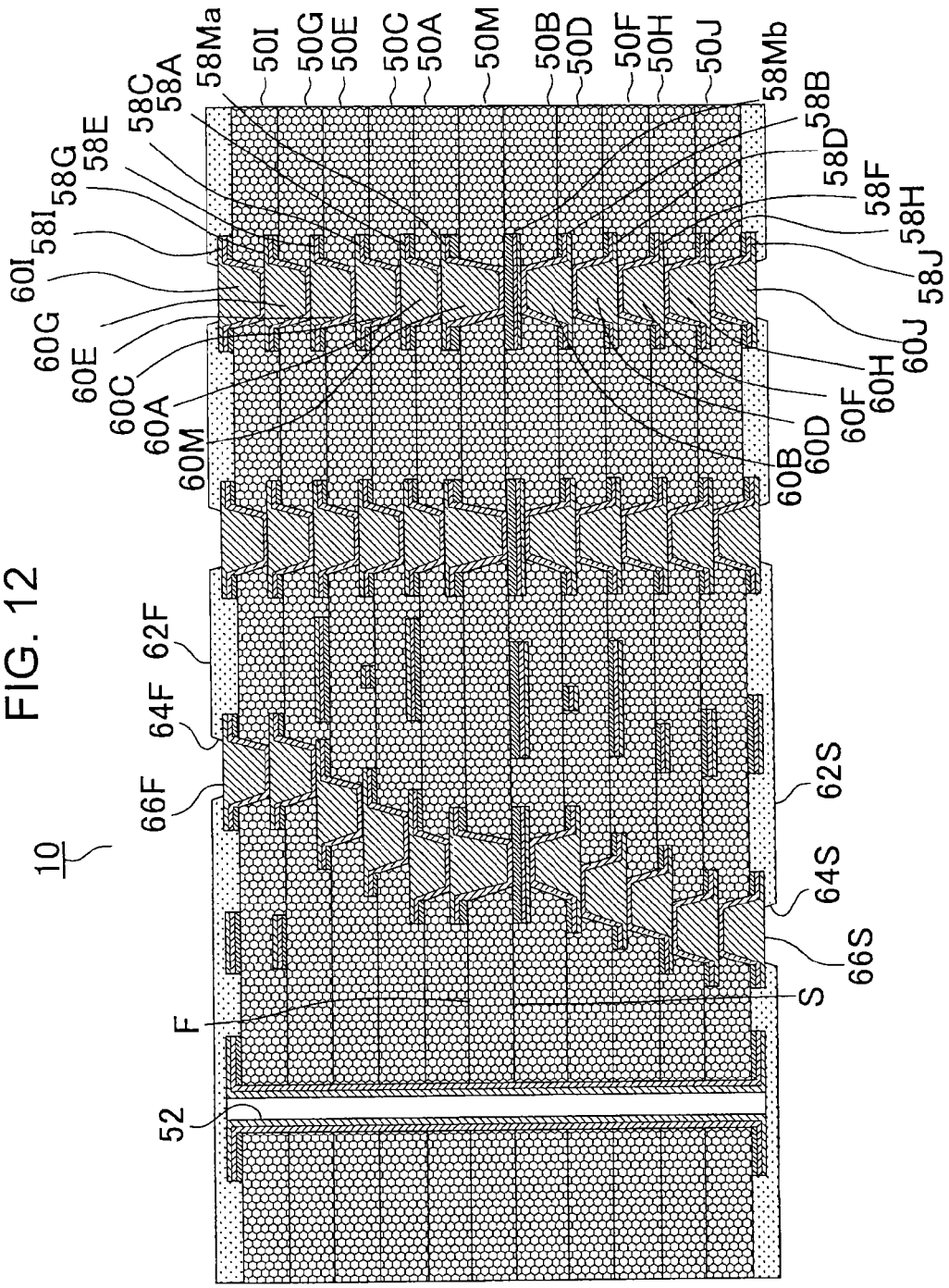
FIG. 12 is a cross-sectional view of a printed wiring board according to the first embodiment.

FIG. 12 is a cross-sectional view showing printed wiring board 10 of the first embodiment before electronic components are mounted. In printed wiring board 10, interlayer insulation layers (50A, 50C, 50E, 50G, 50I) are laminated on the first-surface (F) side of core insulation layer (50M) positioned in the center, and interlayer insulation layers (50B, 50D, 50F, 50H, 50J) are laminated on the second-surface (S) side. Conductive circuit (58Ma) on first surface (F) of core insulation layer (50M) is connected to conductive circuit (58Mb) on second surface (S) by via conductor (60M). A core material is provided in core insulation layer (50M) and a core material is also provided in interlayer insulation layers (50A, 50C, 50E, 50G, 50I) and interlayer insulation layers (50B, 50D, 50F, 50H, 50J).

In interlayer insulation layer (50A) laminated on the first-surface (F) side of core insulation layer (50M), via conductor (60A) is formed to connect conductive circuit (58A) on interlayer insulation layer (50A) to conductive circuit (58Ma) of core insulation layer (50M). In interlayer insulation layer (50C) laminated on interlayer insulation layer (50A), via conductor (60C) is formed to connect conductive circuit (58C) on interlayer insulation layer (50C) to conductive circuit (58A) on interlayer insulation layer (50A). In interlayer insulation layer (50E) laminated on interlayer insulation layer (50C), via conductor (60E) is formed to connect conductive circuit (58E) on interlayer insulation layer (50E) to conductive circuit (58C) on interlayer insulation layer (50C). In interlayer insulation layer (50G) laminated on interlayer insulation layer (50E), via conductor (60G) is formed to connect conductive circuit (58G) on interlayer insulation layer (50G) to conductive circuit (58E) on interlayer insulation layer (50E). In interlayer insulation layer (50I) laminated on interlayer insulation layer (50G), via conductor (60I) is formed to connect conductive circuit (58I) on interlayer insulation layer (50I) to conductive circuit (58G) on interlayer insulation layer (50G). Solder-resist layer (62F) is formed on interlayer insulation layer (50I), and conductive circuit (58I) exposed from opening (64F) of the solder-resist layer works as pad (66F).

In interlayer insulation layer (50B) laminated on the second-surface (S) side of core insulation layer (50M), via conductor (60B) is formed to connect conductive circuit (58B) on interlayer insulation layer (50B) to conductive circuit (58Mb) of core insulation layer (50M). In interlayer insulation layer (50D) laminated on interlayer insulation layer (50B), via conductor (60D) is formed to connect conductive circuit (58D) on interlayer insulation layer (50D) to conductive circuit (58B) on interlayer insulation layer (50B). In interlayer insulation layer (50F) laminated on interlayer insulation layer (50D), via conductor (60F) is formed to connect conductive circuit (58F) on interlayer insulation layer (50F) to conductive circuit (58D) on interlayer insulation layer (50D). In interlayer insulation layer (50H) laminated on interlayer insulation layer (50F), via conductor (60H) is formed to connect conductive circuit (58H) on interlayer insulation layer (50H) to conductive circuit (58F) on interlayer insulation layer (50F). In interlayer insulation layer (50J) laminated on interlayer insulation layer (50H), via conductor (60J) is formed to connect conductive circuit (58J) on interlayer insulation layer (50J) to conductive circuit (58H) on interlayer insulation layer (50H). Solder-resist layer (62S) is formed on interlayer insulation layer (50J), and conductive circuit (58J) exposed from opening (64S) of the solder-resist layer works as pad (66S). Through hole 52 is formed penetrating through interlayer insulation layers (50I, 50G, 50E, 50C, 50A, 50M, 50B, 50D, 50F, 50H, 50J).

Figure 13:
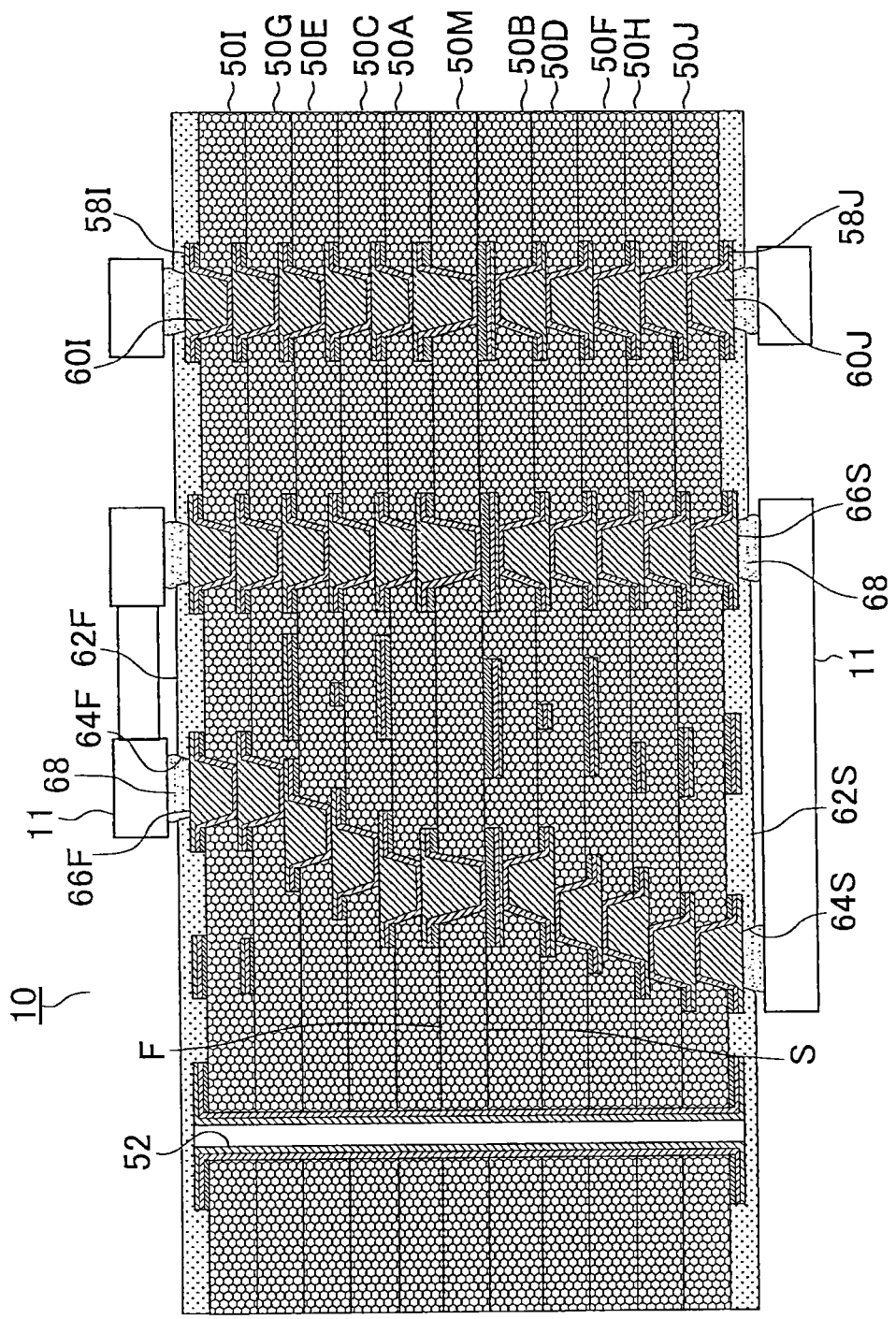
FIG. 13 is a cross-sectional view of a printed wiring board with mounted electronic components in the first embodiment.

FIG. 13 is a cross-sectional view of printed wiring board 10 with mounted electronic components 11. On the first-surface (F) side of printed wiring board 10, electronic component 11 is mounted through solder 68 provided on pad (66F), and on the second-surface (S) side of printed wiring board 10, electronic component 11 is mounted through solder 68 provided on pad (66S).

Figure 2:
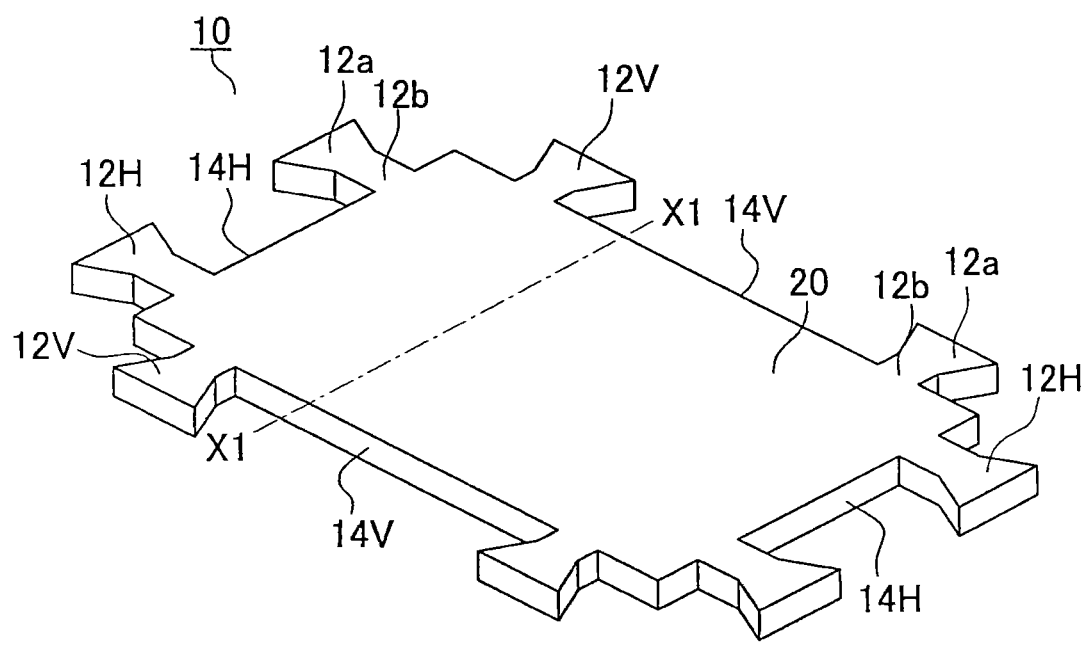
FIG. 2 is a perspective view of a printed wiring board cut out individually.

FIG. 1 is a plan view of multipiece printed wiring board (10G) where 8×4 printed wiring boards 10 are manufactured. FIG. 2 is a perspective view of printed wiring board 10 cut out into an individual piece. FIG. 12 shows part of the cross section taken at (X1-X1) in FIG. 2. As shown in FIG. 1, printed wiring boards 10 are manufactured inside frame 18 positioned along the periphery of multipiece printed wiring board (10G). In printed wiring board 10, two support pieces (12V) are formed along each long-side sidewall (14V) of rectangular main body 20 and are positioned opposite each other to sandwich main body 20 as shown in FIG. 2. Along each short-side sidewall (14H) of main body 20, two support pieces (12H) are formed opposite each other to sandwich main body 20. Support piece (12V) and support piece (12H) are shaped to be the same, and are made up of rectangular base portion (bridge portion) (12b) and trapezoidal portion (12a) with a width that increases toward the tip.

Figure 3A:
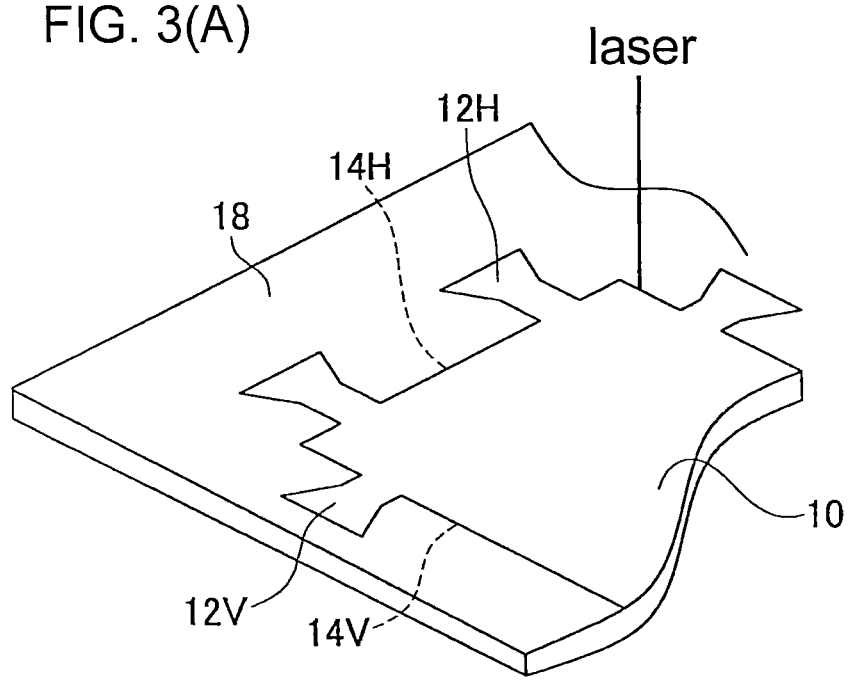
FIGS. 3(A) and 3(B) are a perspective view of a printed wiring board being processed by a laser.
Figure 3B:
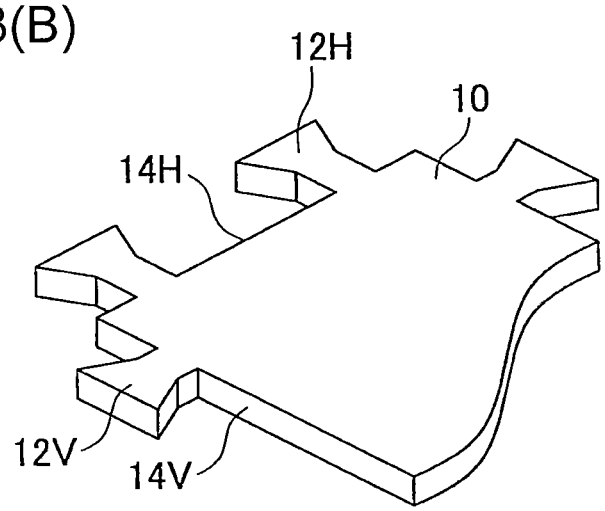

In the first embodiment, when printed wiring board 10 is cut out from multipiece printed wiring board (10G), a laser is used to cut along the outline of printed wiring board 10 as shown in FIG. 3(A) to be cut out as an individual piece as shown in FIG. 3(B).

Figure 4A:
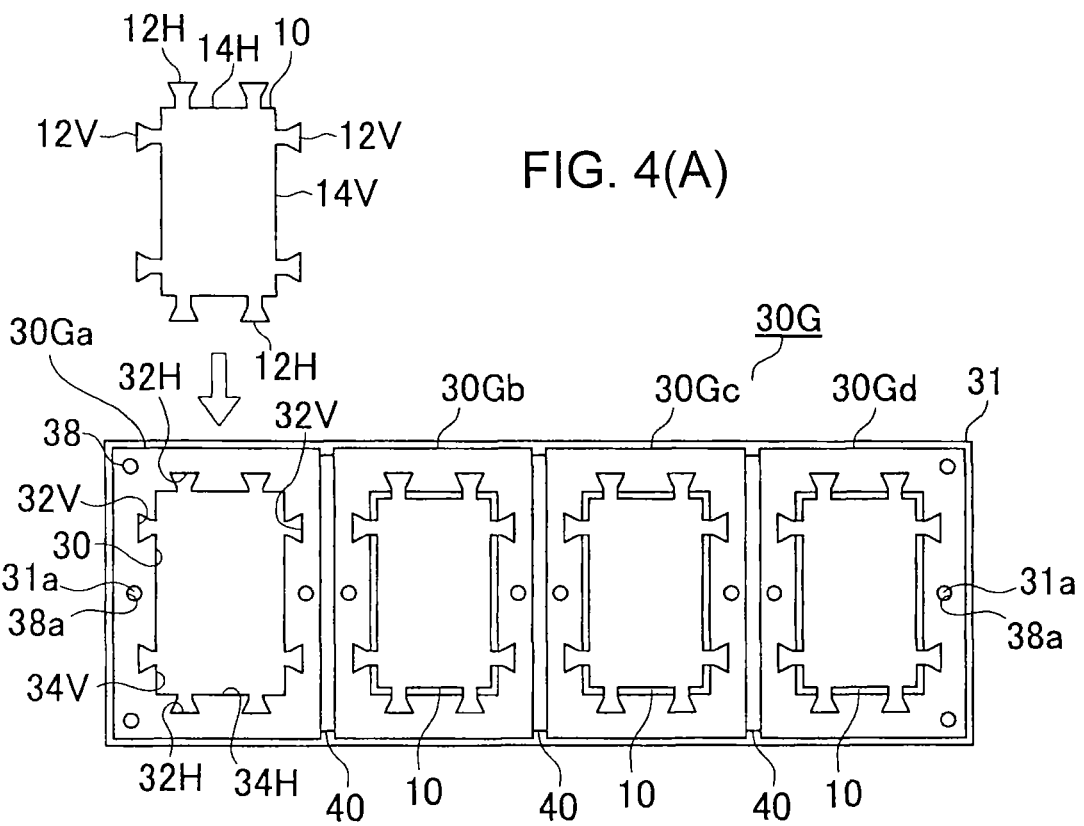
FIG. 4(A) is a plan view of connected metal frames.
Figure 4B:
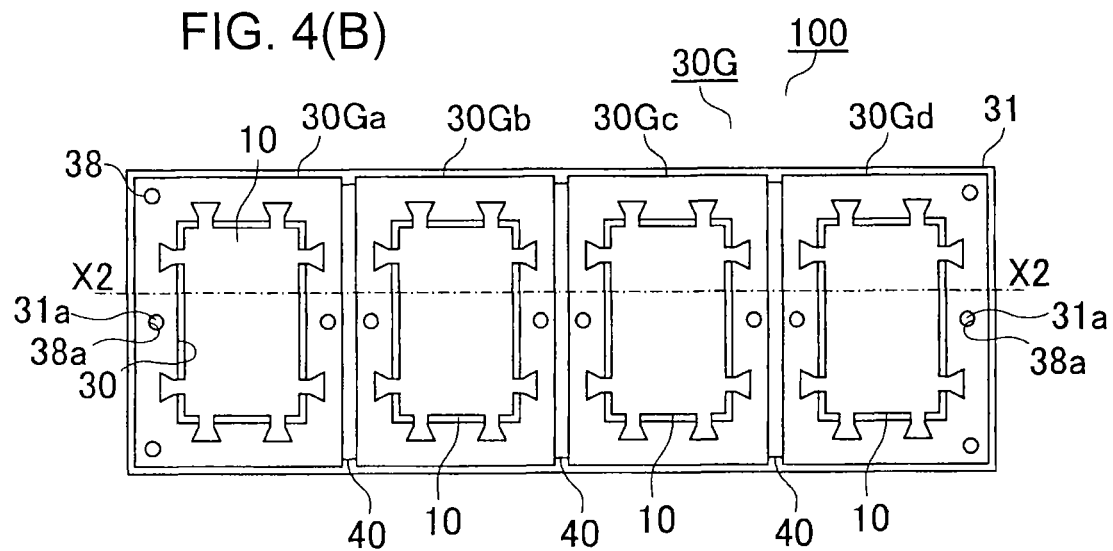
FIG. 4(B) is a plan view of a combined wiring board.
Figure 5:
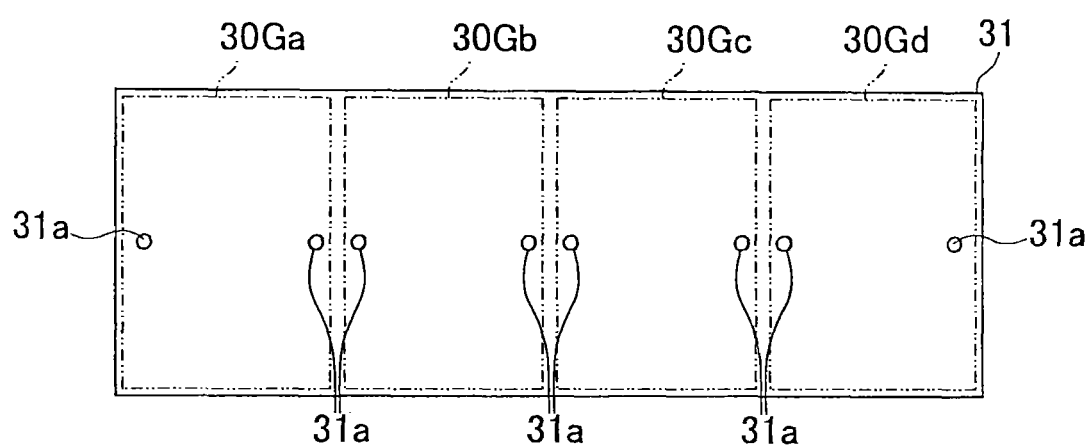
FIG. 5 is a plan view of a pin sheet.
Figure 6:
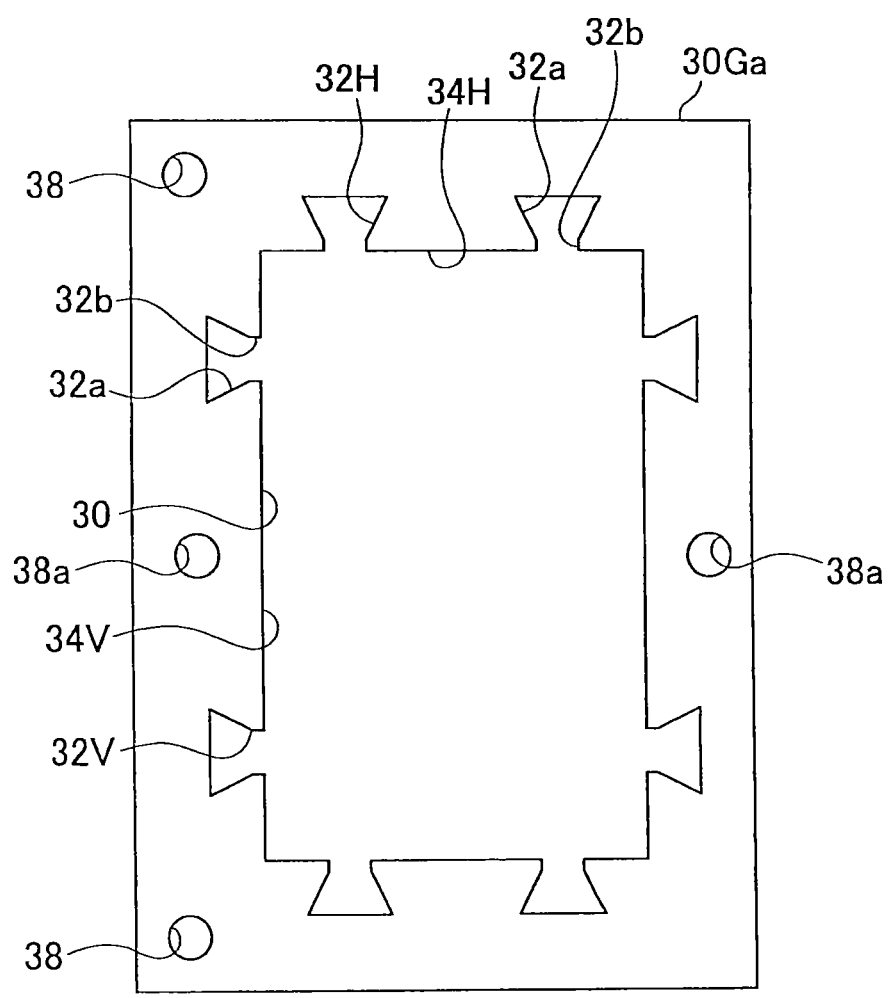
FIG. 6 is a plan view of a metal frame.

FIG. 4(A) is a plan view of connected metal frame (30G) and FIG. 4(B) shows a state where a printed wiring board 10 is accommodated in opening 30 of each of metal frames (30Ga~30Gd). FIG. 5 is a plan view of pin sheet 31. FIG. 6 is a plan view of metal frame (30Ga).

Connected metal frame (30G) has four aluminum metal frames (30Ga~30Gd) and pin sheet 31 that works as an alignment member for positioning metal frames (30Ga~30Gd). In each of metal frames (30Ga~30Gd), two pin-insertion holes (38a) are formed for alignment purposes. As shown in FIG. 5, eight pins (31a) for fixing metal frames are provided for pin sheet 31. Pins (31a) are positioned so as to array metal frames (30Ga~30Gd) at predetermined intervals when pins are inserted through pin insertion holes (38a) as shown in FIG. 4(A). Metal frames (30Ga~30Gd) aligned onto pin sheet 31 using pin insertion holes (38a) are connected to each other by adhesive agent 40, which works as a connecting portion. The outer diameter of pin (31a) is set smaller than the inner diameter of pin insertion hole (38a) so as to allow an margin for alignment of metal frames (30Ga~30Gd) with respect to pin sheet 31. Alignment holes 38 are formed in the peripheries of metal frames (30Ga) and (30Gd), which form four corners of connected metal frame (30G).

Except for alignment marks 38, metal frames (30Ga~30Gd) are shaped to be the same and each has accommodation opening 30 to accommodate printed wiring board 10 as shown in FIG. 6. Opening 30 is formed to have vertical wall (34V) corresponding to long-side sidewall (14V) of printed wiring board 10 as well as horizontal wall (34H) corresponding to short-side sidewall (14H) of printed wiring board 10. Along vertical walls (34V), four slits (32V) are formed corresponding to four support pieces (12V) of printed wiring board 10; and along horizontal walls (34H), four slits (32H) are formed corresponding to four support pieces (12H) of printed wiring board 10. Slits (32H, 32V) are each made up of base portion (32b), corresponding and identical to rectangular base portion (bridge portion) (12b) of support pieces (12V, 12H) of printed wiring board 10, and trapezoidal portion (32a), corresponding and identical to trapezoidal portion (12a) of support pieces (12V, 12H) of printed wiring board 10. The width of trapezoidal portion (32a) increases toward the periphery of opening 30. Vertical wall (34V) is formed to have predetermined clearance with long-side sidewall (14V), which is supported by support piece (12V) fit into slit (32V), and horizontal wall (34H) is formed to have approximately the same clearance with short-side sidewall (14H), which is supported by support piece (12H) fit into slit (32H).

As shown in FIG. 4(B), printed wiring boards 10 are individually accommodated in accommodation opening 30 of each of metal frames (30Ga~30Gd) in such a way that printed wiring board 10 is supported by support piece (12H) inserted in slit (32H) of accommodation opening 30 and support piece (12V) inserted in slit (32V). After metal frames (30Ga~30Gd) are connected to pin sheet 31, printed wiring boards 10 are accommodated as shown in FIG. 4.

Figure 7:
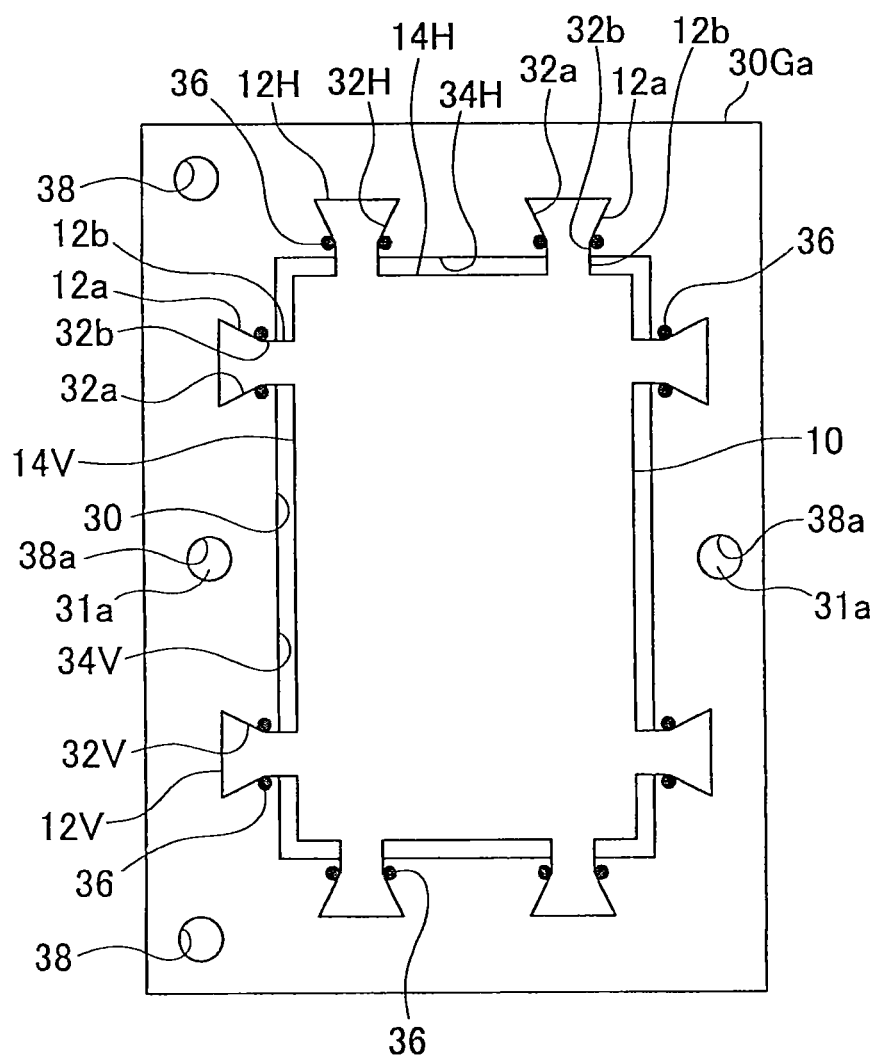
FIG. 7 is a plan view of a crimped printed wiring board.

FIG. 7 shows a state where printed wiring board 10 is crimped and fixed to accommodation opening 30 of metal frame (30Ga).

As shown in FIG. 7, using crimping tool 200, crimped portions 36 are formed at portions which are each positioned at a border between base portion (32b) and trapezoidal portion (32a) of slits (32H, 32V), and are adjacent to support pieces (12H, 12V) respectively. Crimped portions 36 cause sidewalls of slits (32H, 32V) to abut sidewalls of support pieces (12H, 12V) respectively and to undergo plastic deformation to be bonded therein. Accordingly, printed wiring boards 10 are fixed to metal frames (30Ga~30Gd) respectively.

Figure 8A:
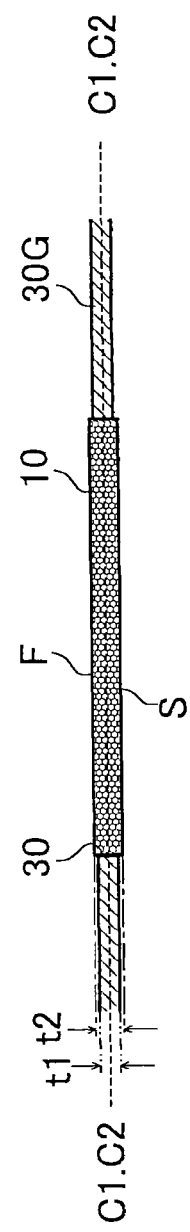
FIGS. 8(A) and 8(B) are views showing part of a combined wiring board.

FIG. 8(A) shows a part of a cross section taken at (X2-X2) of printed wiring board 10 in FIG. 4(B).

Metal frames (30Ga~30Gd) are each set to have a thickness (t1) of 750 μm, and printed wiring board 10 is set to have a thickness (t2) of 780 μm. Namely, the thickness of each of metal frames (30Ga~30Gd) is less than that of printed wiring board 10. In addition, printed wiring board 10 is fixed to each of metal frames (30Ga~30Gd) in such a way that center plane (C1) of each of metal frames (30Ga~30Gd) (connected metal frame (30G)) in a thickness direction corresponds to center plane (C2) of printed wiring board 10 in the thickness direction. Therefore, each of metal frames (30Ga~30Gd) is recessed from upper surface (first surface) (F) of printed wiring board 10, and each of metal frames (30Ga~30Gd) is recessed from lower surface (second surface) (S) of printed wiring board 10. Accordingly, when an electronic component is mounted on printed wiring boards 10, metal frames (30Ga~30Gd) do not interfere with the mounting procedure.

The coefficient of thermal expansion along a main surface of metal frames (30Ga~30Gd) made of aluminum is 23 ppm/° C., and the coefficient of thermal expansion along a main surface of printed wiring board 10 made of resin is 16 ppm/° C. The coefficient of thermal expansion of metal frames (30Ga~30Gd) is greater than that of printed wiring board 10. By adjusting the thickness of each of metal frames (30Ga~30Gd) to be less than that of printed wiring board 10, warping caused by the difference in thermal expansion coefficients is suppressed from occurring in printed wiring board 10. In the first embodiment, aluminum was used as the material for forming metal frames (30Ga~30Gd). However, any other material such as copper or stainless steel may also be used as long as it has a greater thermal expansion coefficient than printed wiring board 10.

Figures 9A, 9B:
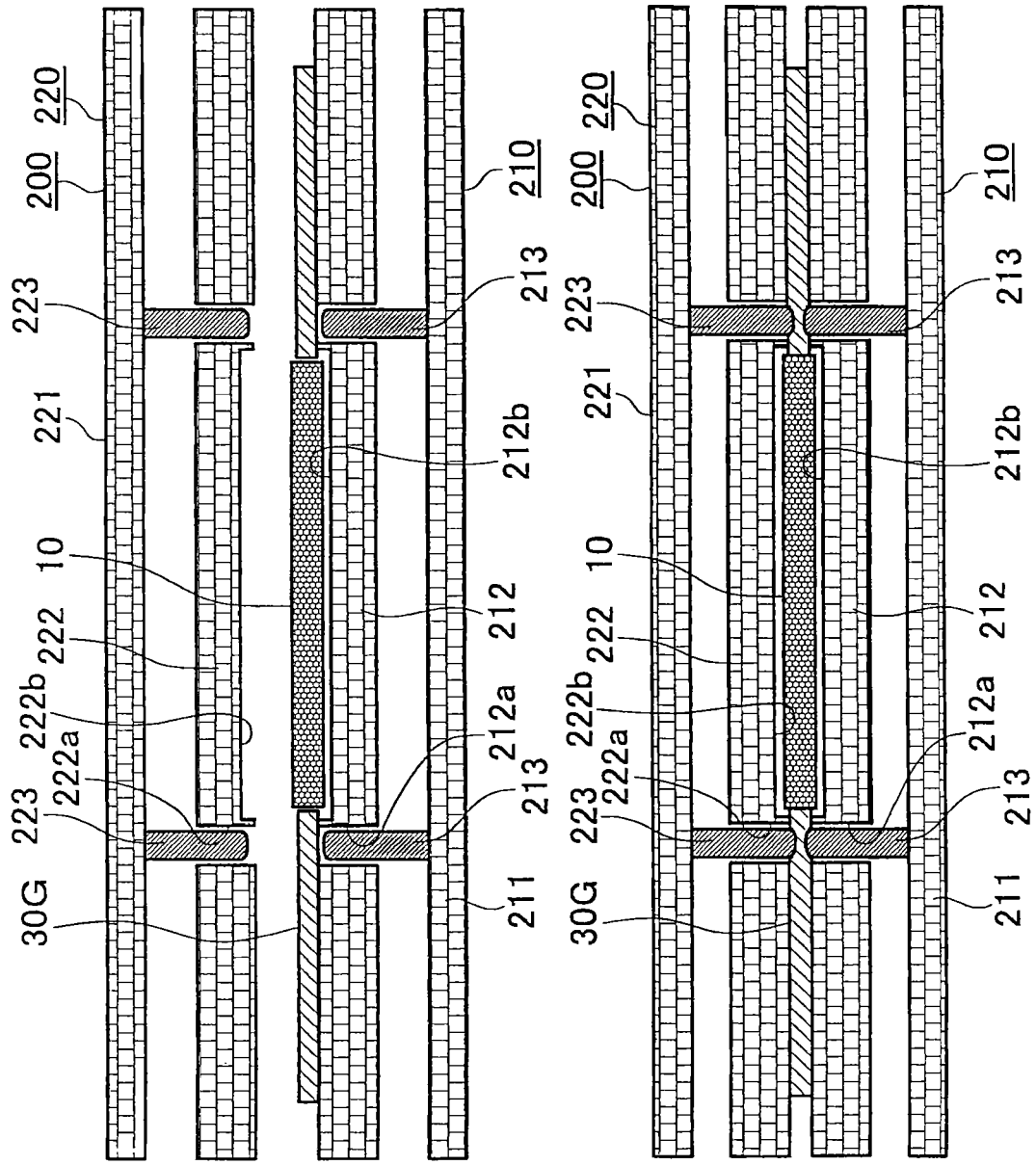
FIGS. 9(A) and 9(B) are views of a crimping tool in a first embodiment.

FIG. 9(A) is a cross-sectional view of crimping tool 200 to crimp printed wiring board 10.

Crimping tool 200 is a tool for crimping printed wiring board 10 accommodated in opening 30 supported by support pieces (12V, 12H). Crimping tool 200 is provided with lower die 210 and upper die 220. Lower die 210 has base 211 and support plate 212. Support plate 212 is formed to be vertically movable with respect to base 211. Crimping punch 213 is provided for base 211 and penetrating hole (212a) is formed in support plate 212 for punch 213 to pass through. Recessed portion (212b) is formed in the center of support plate 212 to prevent force from being exerted on printed wiring board 10 during the crimping process. Printed wiring board 10 is placed on recessed portion (212b), and connected metal frame (30G) is placed on support plate 212.

Upper die 220 is provided with base 221 and support plate 222. Support plate 222 is formed to be vertically movable with respect to base 221. Crimping punch 223 is formed for base 221, and penetrating hole (222a) is formed in support plate 222 for punch 223 to pass through. Recessed portion (222b) is formed in the center of support plate 222 to prevent force from being exerted on printed wiring board 10 during the crimping process.

FIG. 9(B) is a view showing a state where upper die 220 is pressed against lower die 210, punches 223 of upper die 220 are pressed against the upper surface of connected metal frame (30G), and punches 213 of lower die 210 are pressed against the lower surface of connected metal frame (30G). Using crimping tool 200, crimped portions 36 shown in FIG. 7 are simultaneously formed in each of metal frames (30Ga~30Gd) that are prepared as shown in FIG. 4(B). Printed wiring board 10 is fixed to each of metal frames (30Ga~30Gd) by crimped portions 36 formed as above. Accordingly, combined wiring board 100, which is made of printed wiring boards 10 and connected metal frame (30G), is completed and ready for a reflow process.

In combined wiring board 100 of the first embodiment, printed wiring boards 10 are individually accommodated in and fixed to metal frames (30Ga~30Gd). Thus, using the difference in coefficients of thermal expansion of printed wiring board 10 and metal frames (30Ga~30Gd), warping is made unlikely to occur in printed wiring board 10, especially when metal frames (30Ga~30Gd) aligned by pin sheet 31 are connected to each other by adhesive agent 40. Thus, such a structure reduces variations in warping caused by the positional difference of each wiring board 10 in combined wiring board 100 (for example, a position at an edge or in the center), and differences in the effects of warping reduction are minimized compared with a structure where multiple printed wiring boards are accommodated in and fixed to one metal frame. Moreover, since the number of printed wiring boards 10 in combined wiring board 100 is easily adjusted by changing the number of connected metal frames, efficiency is improved when mounting components on printed wiring boards 10. In addition, metal frames (30Ga~30Gd) may be connected to each other by adhesive agent 40 using an alignment member that is different from pin sheet 31, or may be connected to each other by adhesive agent 40 without using an alignment member such as pin sheet 31.

Furthermore, since crimped portions 36 are simultaneously formed in each accommodation opening 30, printed wiring boards 10 are accurately aligned to metal frames (30Ga~30Gd) of connected metal frame (30G). Here, compared with a structure where an adhesive agent or the like is used to fix printed wiring boards 10, all printed wiring boards 10 are accurately aligned to metal frames (30Ga~30Gd) through simultaneous crimping procedures. In addition, positional shifting among printed wiring boards is minimized.

Figures 10A, 10B:
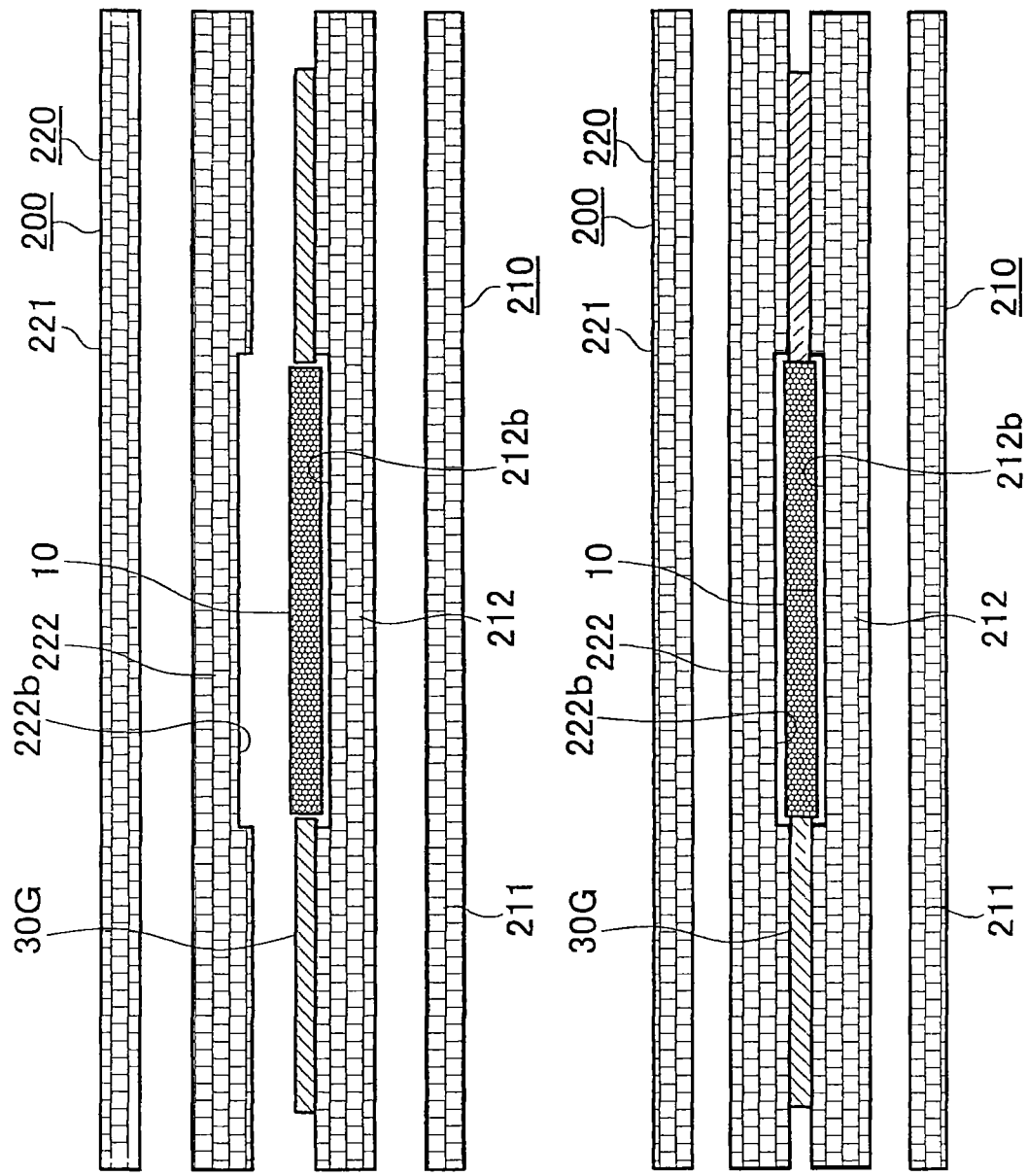
FIGS. 10(A) and 10(B) are views of a crimping tool in a first modified example of the first embodiment.

FIG. 10 shows cross-sectional views of crimping tool 200 used in a first modified example of the first embodiment. In the first modified example, punches are not used, but support plate 222 of upper die 220 and support plate 212 of lower die 210 are used to cause plastic deformation in the entire connected metal frame (30G) so that printed wiring boards 10 are fixed to connected metal frame (30G).

Figure 8B:
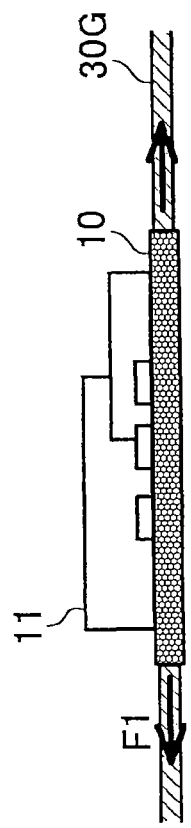

After printed wiring board 10 is fixed to accommodation opening 30 of each of metal frames (30Ga~30Gd) through crimping (see FIG. 7), solder printing is conducted, electronic components 11 or the like are positioned, and electronic components 11 or the like are mounted in a reflow oven. Since a reflow temperature approaching 200° C. exceeds the glass transition temperature (Tg) of resin in printed wiring board 10, printed wiring board 10 tends to warp due to the weight of mounted electronic component 11 and residual stress in the wiring board. As shown in FIG. 8(B), stress toward the center of printed wiring board 10 is generated together with stress from the weight of electronic component 11 or the like in printed wiring boards 10 of the first embodiment fixed to metal frames (30Ga~30Gd). However, since the coefficient of thermal expansion along each main surface of metal frames (30Ga~30Gd) is higher than that of printed wiring board 10 as described above, expansion of metal frames (30Ga~30Gd) in planar directions is greater than that of printed wiring boards 10. Thus, on printed wiring board 10 fixed in accommodation opening 30, stress (F1) is exerted toward the periphery so as to cancel out the aforementioned stress toward the center of printed wiring board 10. Accordingly, warping is unlikely to occur in printed wiring board 10 during the reflow process.

Printed wiring board 10 according to the first modified example of the first embodiment has a structure shown in FIG. 12, and core material is provided to core insulation layer (50M) while no core material is provided in interlayer insulation layers (50A, 50C, 50E, 50G, 50I) or in interlayer insulation layers (50B, 50D, 50F, 50H, 50J). Thus, warping tends to occur in printed wiring board 10, but such warping is suppressed by connected metal frame (30G) so that warping is unlikely to occur in a reflow process.

Figure 11:
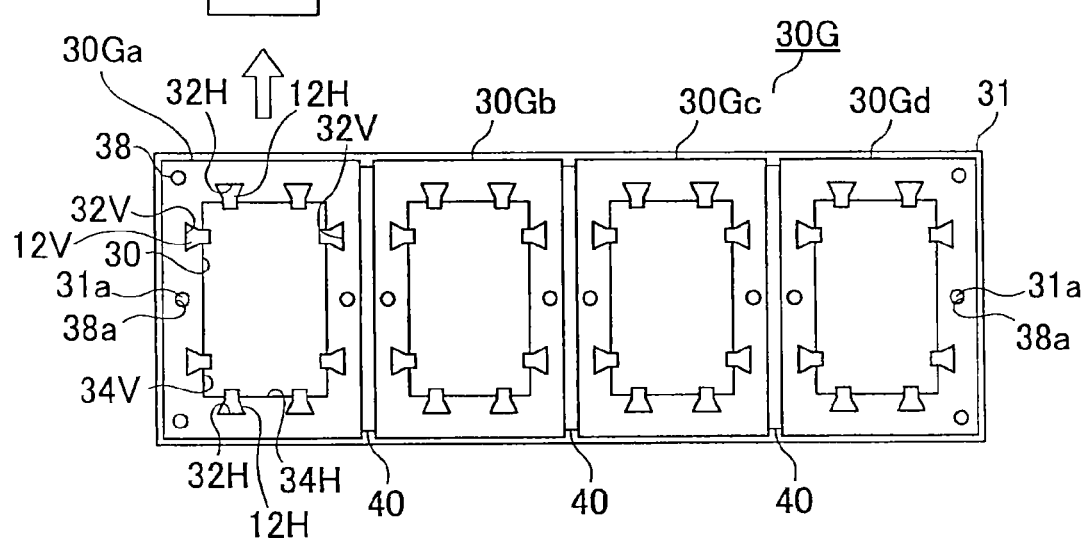
FIG. 11 is a plan view of a printed wiring board cut out from a combined wiring board.

After electronic components are mounted, rectangular main body 20 is cut out from support pieces (12H, 12V) of printed wiring board 10 as shown in FIG. 11 so that main body 20 of printed wiring board 10 is separated while support pieces (12H, 12V) remain in slits (32H, 32V) formed in each accommodation opening 30 of metal frames (30Ga~30Gd).

Second Modified Example of First Embodiment

Figure 14:
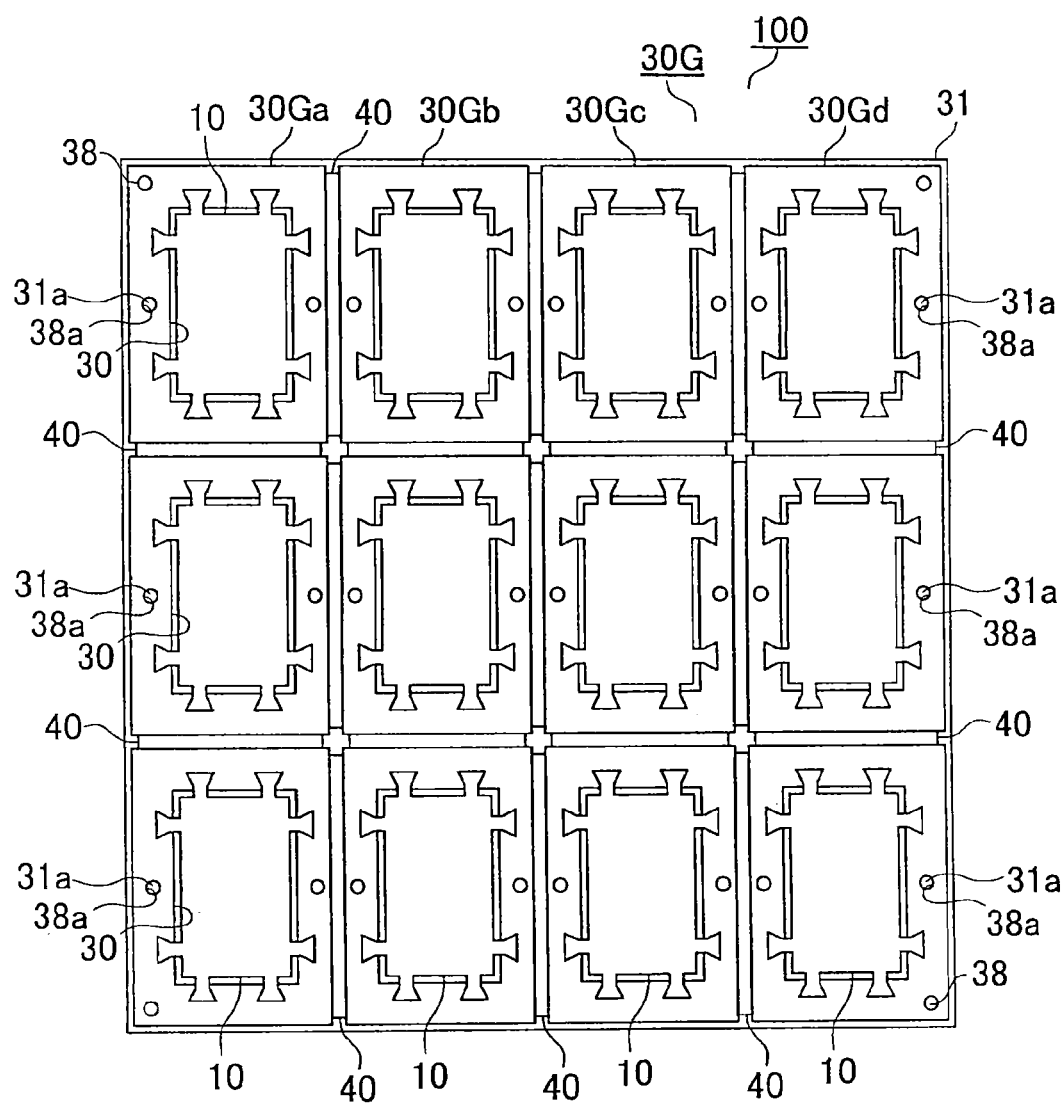
FIG. 14 is a plan view of a combined wiring board according to a second modified example of the first embodiment.

FIG. 14 shows a combined wiring board according to a second modified example of the first embodiment.

In the second modified example, connected metal frame (30G) is formed using pin sheet 31 and adhesive agent 40 in such a way that metal frames (30Ga~30Gd) are positioned not only in one direction but also in a 2D array as shown in FIG. 14. The structure in the second modified example allows more wiring boards 10 to be fixed in a limited space.

Third Modified Example of First Embodiment

Figure 15:
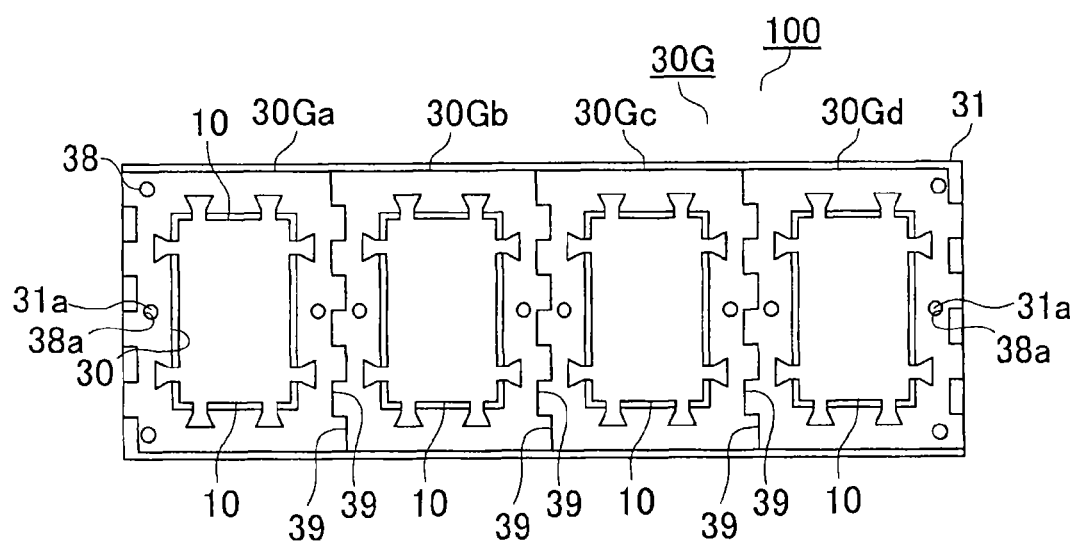
FIG. 15 is a plan view of a combined wiring board according to a third modified example of the first embodiment.

FIG. 15 shows a combined wiring board according to a third modified example of the first embodiment.

In the third modified example, concavo-convex coupling portion 39 is formed along each periphery of metal frames (30Ga~30Gd) so that metal frames (30Ga~30Gd) are connected to each other by engaging coupling portions 39 as shown in FIG. 15. Warping is also less likely to occur in printed wiring board 10 by setting the structure according to the third modified example of the first embodiment. Metal frames (30Ga~30Gd) may be aligned by engaging coupling portions 39 without using pin sheet 31, or adhesive agent 40 may be coated between coupling portions 39.

Connection of metal frames (30Ga~30Gd) or the like is not limited to using adhesive agent 40 or coupling portions 39. For example, crimping, ultrasonic bonding, welding or the like may also be employed.

Fourth Modified Example of First Embodiment

Figure 16A:
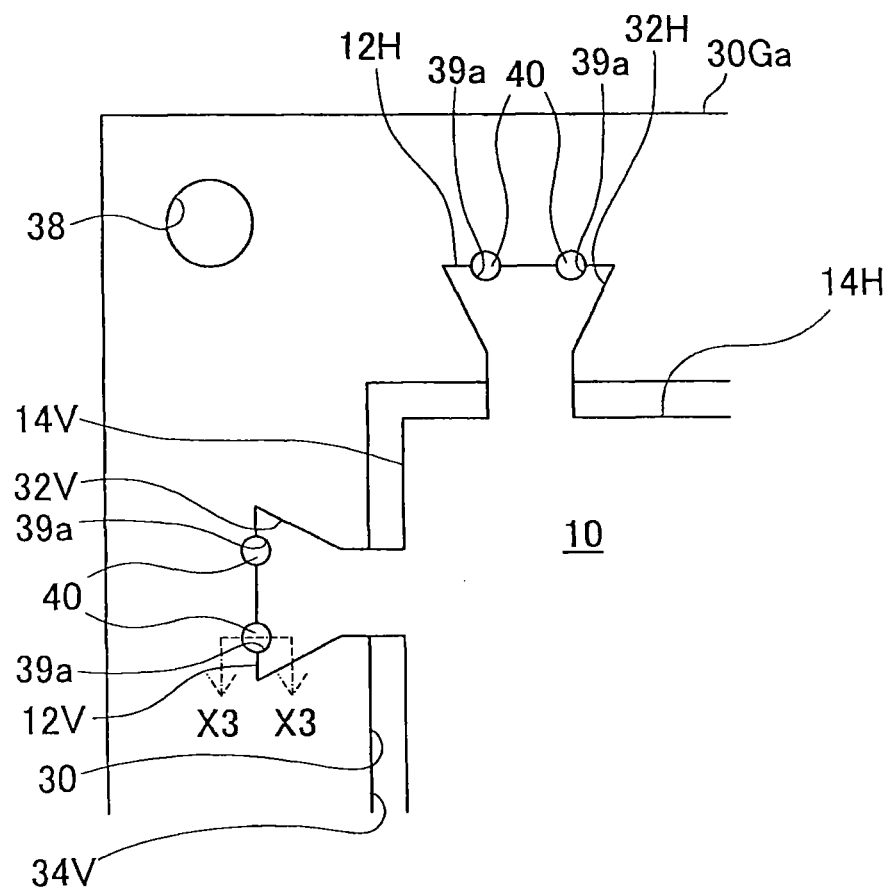
FIGS. 16(A) and 16(B) are plan views showing main portions of a combined wiring board in a fourth modified example of the first embodiment.
Figure 16B:
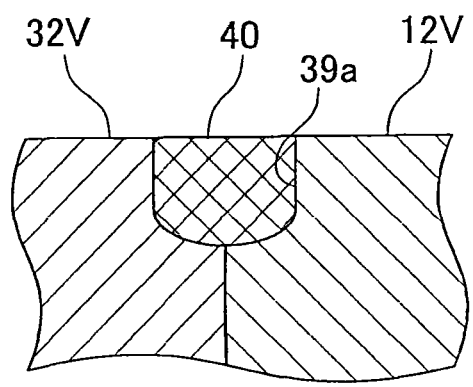

FIG. 16(A) is an enlarged view showing part of metal frame (30Ga) according to a fourth modified example of the first embodiment, and FIG. 16(B) shows part of the cross section taken at (X3-X3) in the vicinity of support piece (12V) in FIG. 16(A).

In the fourth modified example, as shown in FIG. 16(A), bottomed hole (39a) is formed to bridge slit (32H) of each of metal frames (30Ga~30Gd) and support piece (12H) of printed wiring board 10, while another bottomed hole (39a) is formed to bridge slit (32V) and support piece (12V) (see FIG. 16(B)). Adhesive agent 40 is filled in each hole (39a). According to the structure of the fourth modified example, unsteady loose settings of printed wiring board 10 accommodated in opening 30 are prevented in each of metal frames (30Ga~30Gd).

Fifth Modified Example of First Embodiment

Figure 17:
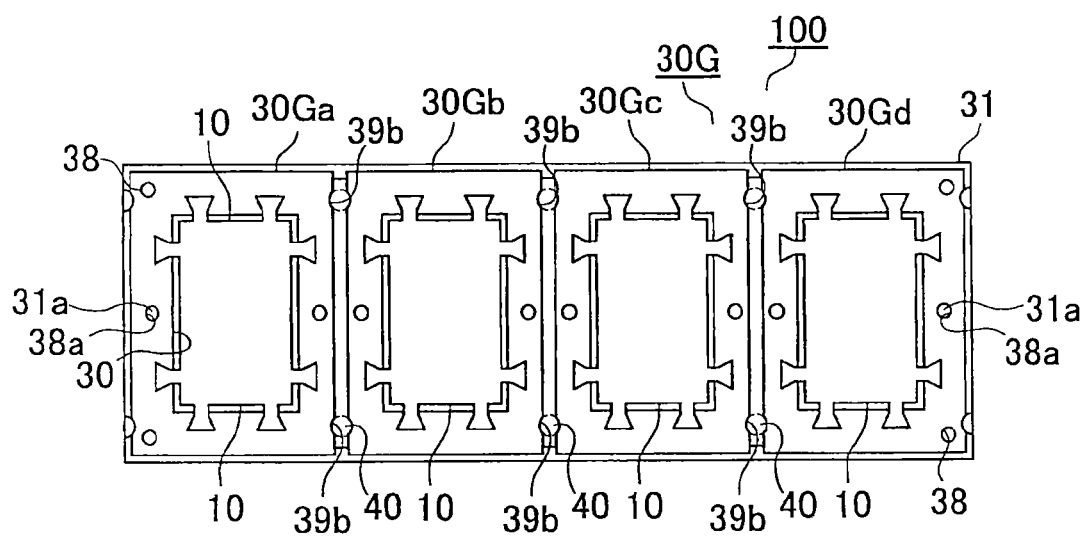
FIG. 17 is a plan view of a combined wiring board according to a fifth modified example of the first embodiment.

FIG. 17 shows a combined wiring board according to a fifth modified example of the first embodiment.

In the fifth modified example, bottomed hole (39b) which bridges adjacent metal frames is formed in pin sheet 31 or the like as shown in FIG. 17, and adhesive agent 40 is filled in each hole (39b). The structure employed in the fifth modified example is capable of achieving further accurate alignment of metal frames (30Ga~30Gd) to pin sheet 31.

Sixth Modified Example of First Embodiment

FIG. 18 shows a combined wiring board according to a sixth modified example of the first embodiment.

Figure 18A:
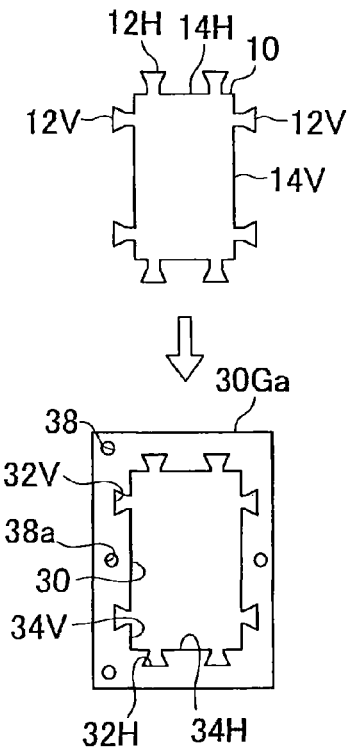
FIGS. 18(A) and 18(B) are plan views of a combined wiring board according to a sixth modified example of the first embodiment.
Figure 18B:
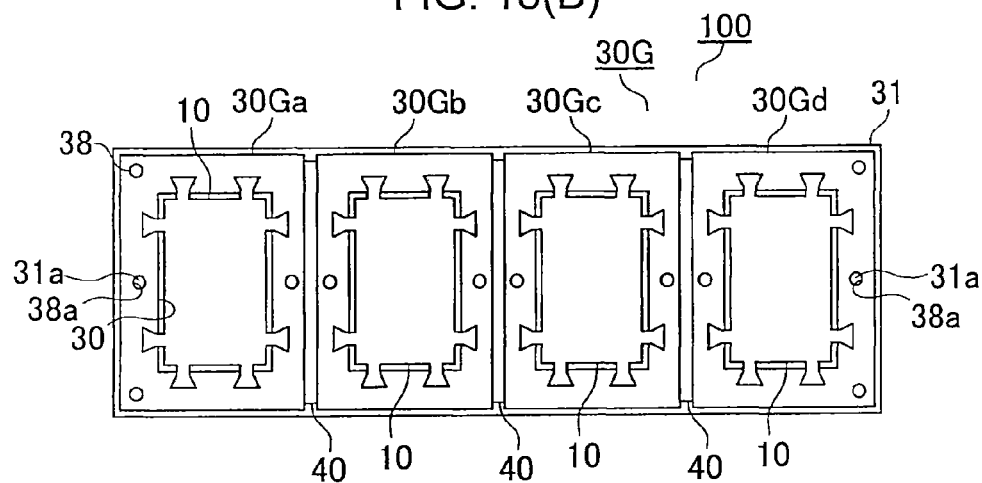

In the sixth modified example, after printed wiring board 10 is accommodated into each opening 30 of metal frames (30Ga~30Gd) as shown in FIG. 18(A), metal frames (30Ga~30Gd) are connected to each other by using pin sheet 31 and adhesive agent 40 as shown in FIG. 18(B). Using the structure employed in the sixth modified example also reduces variations in warping caused by positional differences among wiring boards 10 in combined wiring board 100, thus minimizing differences in the effects of warping reduction.

Seventh Modified Example of First Embodiment

Figure 19A:
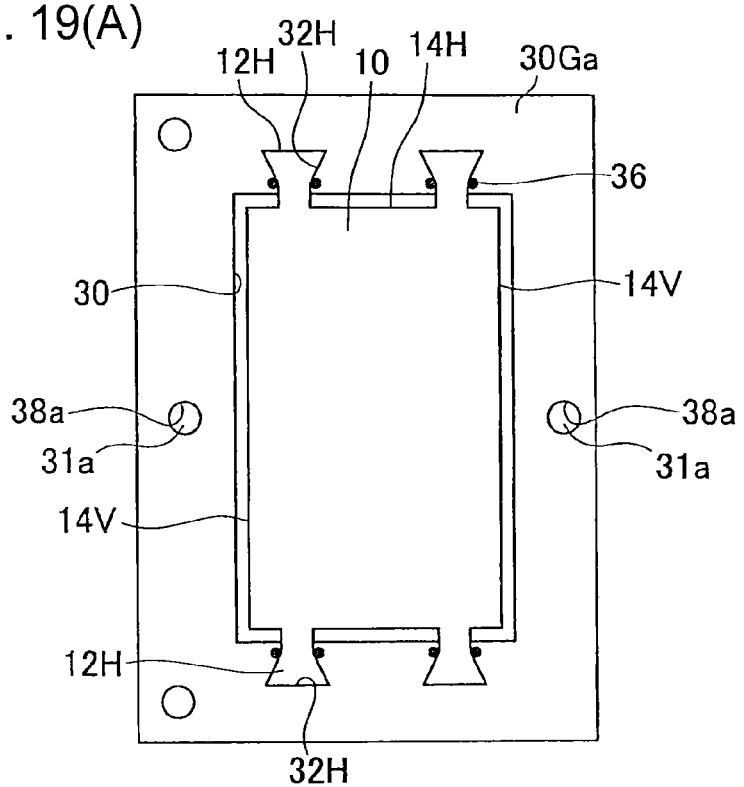
FIG. 19(A) is a plan view of a combined wiring board according to a seventh modified example of the first embodiment.

FIG. 19(A) shows a combined wiring board according to a seventh modified example of the first embodiment.

In the seventh modified example, two support pieces (12H) are formed along each short-sided sidewall (14H) to be positioned opposite each other sandwiching rectangular main body 20 of printed wiring board 10. There is no support piece formed along long-sided sidewall (14V). Processing printed wiring board 10 is simpler using the structure in the seventh modified example.

Eighth Modified Example of First Embodiment

Figure 19B:
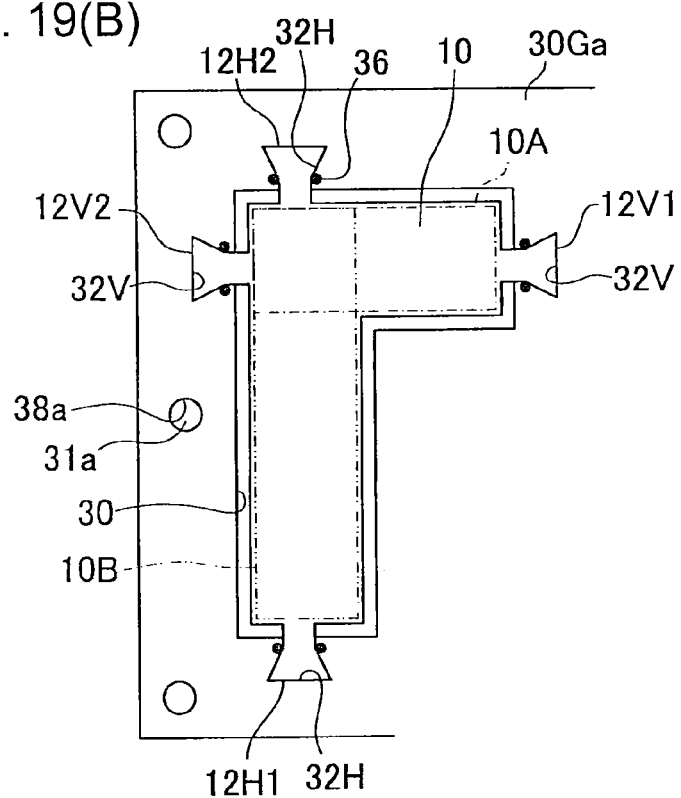
FIG. 19(B) is a plan view of a combined wiring board according to an eighth modified example of the first embodiment.

FIG. 19(B) shows a combined wiring board according to an eighth modified example of the first embodiment.

In the eighth modified example, printed wiring board 10 is formed in an L-shape formed by combining rectangular portion (10A) and rectangular portion (10B). Support piece (12V1) is formed at an edge on the right side of the L-shape in the view, and support piece (12V2) is formed in a portion opposite support piece (12V1). In the same manner, support piece (12H1) is formed at an edge on the lower side of the L-shape in the view, and support piece (12H2) is formed in a portion opposite support piece (12H1). Namely, two opposing short sides of rectangular shapes (10A, 10B) are connected to each accommodation opening 30 of metal frames (30Ga~30Gd), and two opposing long sides are not connected to accommodation opening 30. As shown in the eighth modified example, by providing support pieces in opposing portions, printed wiring boards 10 in any shape can be fixed to metal frames (30Ga~30Gd).

Second Embodiment

FIG. 20(A) shows combined wiring board (100a) according to a second embodiment.

Combined wiring board (100a) is structured to have multiple printed wiring boards 110 to be reflowed, which are connected by metal frame (130G). Connected metal frame (130G) is made up of three aluminum metal frames (130Ga~130Gc) and pin sheet 131 for aligning and connecting metal frames (130Ga~130Gc). Pin (131a) is inserted into pin insertion hole (138a) formed in each of metal frames (130Ga~130Gc) for alignment, and metal frames (130Ga~130Gc) are connected to each other by adhesive agent 40.

Printed wiring board 110 is accommodated in accommodation opening 130 of each of metal frames (130Ga~130Gc). The thicknesses of connected metal frame (130G) and printed wiring board 110 are respectively the same as those of connected metal frame (30G) and printed wiring board 10. The central plane of connected metal frame (130G) in a thickness direction corresponds to the central plane of printed wiring board 110 in the thickness direction. Thus, connected metal frame (130G) is recessed from upper surface (first surface) (F) of printed wiring board 110, and connected metal frame (130G) is recessed from lower surface (second surface) (S) of printed wiring board 110. The coefficient of thermal expansion along a main surface of connected metal frame (130G) made of aluminum is 23 ppm/° C., and the coefficient of thermal expansion along a main surface of printed wiring board 110 made of resin is 16 ppm/° C.

In printed wiring board 110, one support piece (112H) is formed on each short-side sidewall (114H) of rectangular main body 120 so as to face each other to sandwich main body 120. Bridge portion 122 formed with slits 124 is provided between main body 120 and support piece (112H). As shown in FIG. 20(B), bridge portion 122 is formed between slits (124, 124) or between slit 124 and a sidewall.

A pair of extension tabs (112Hh) to increase the width in substantially a U-shape is provided for support piece (112H), and crimped portions (136a, 136b) are formed at the base of each extension tab (112Hh). Crimped portions (136a, 136b) cause the sidewall of accommodation opening 130 to make contact with and then be pushed against the sidewall of extension tab (112Hh). Except for the portions of extension tab (112Hh) fixed by crimped portions (136a, 136b), the sidewall of printed wiring board 110 is not in contact with the sidewall of accommodation opening 130. Moreover, recess 142 is provided for accommodation opening 130 along straight portion (112Hc) between crimped portions (136a) so as to avoid interference. Accordingly, stress is prevented from being exerted on straight portion (112Hc) when printed wiring board 110 undergoes thermal contraction. For the same reasons, clearance is provided between long-side sidewall (114V) of main body 120 and accommodation opening 130. As shown by chain line (H1-H1) in FIG. 20(A), openings 140 are formed on the line that connects crimped portion (136a) provided at an end of straight portion (112Hc) of one support piece (112H) and crimped portion (136a) provided at an end of straight portion (112Hc) of the other support piece (112H). Openings 140 relieve excess stress exerted on printed wiring board 110 in a vertical direction during a reflow process.

Furthermore, slits 124 are positioned to avoid the line that connects a pair of crimped portions (136a) so as to uniformly mitigate stress exerted inside the printed wiring board.

Figure 21A:
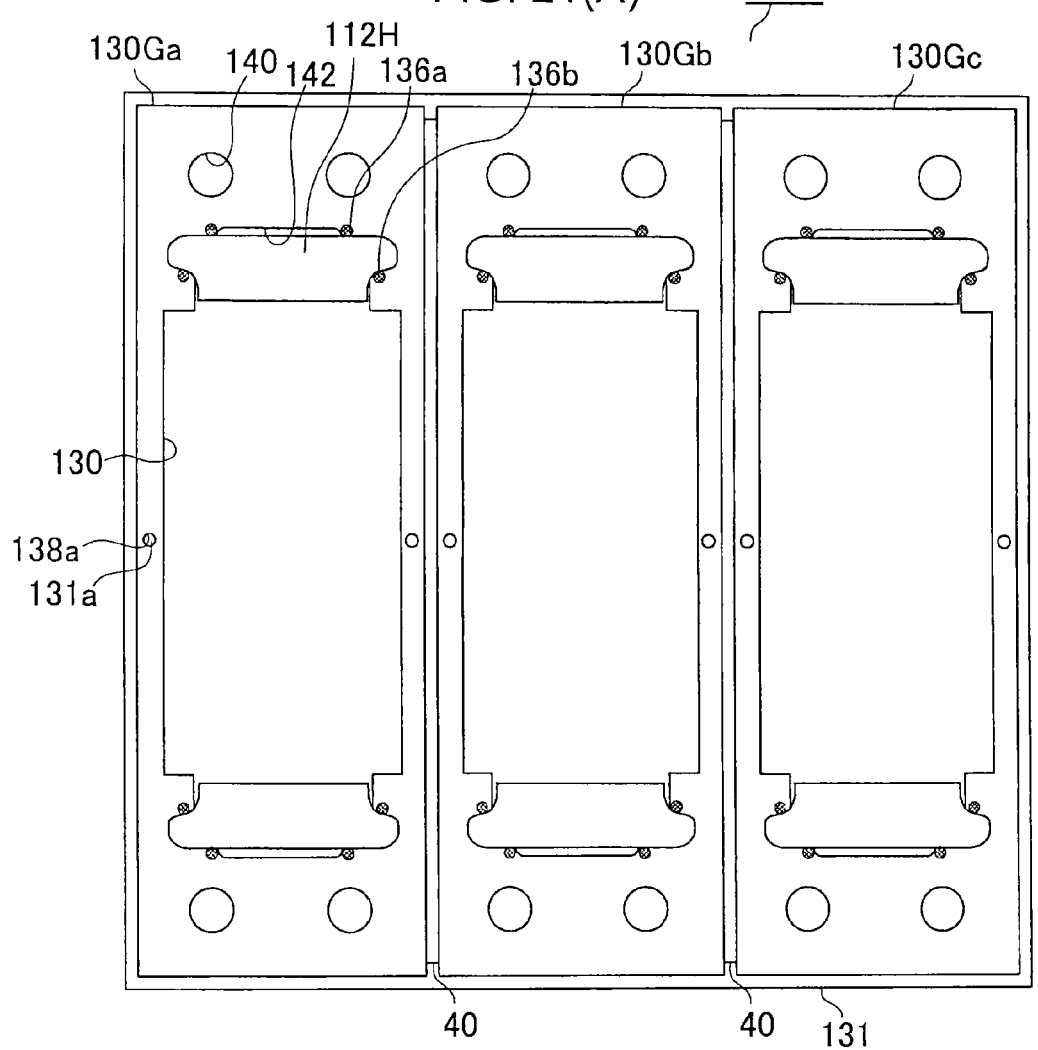
FIG. 21(A) is a plan view of connected metal frames according to the second embodiment.
Figure 21B:
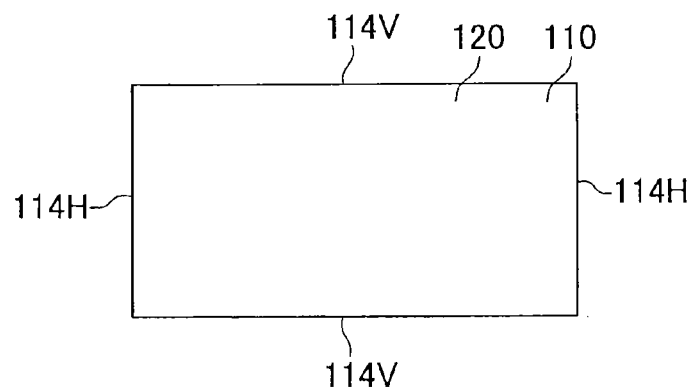
FIG. 21(B) is a plan view of a printed wiring board.

FIG. 21(A) shows connected metal frame (130G) from which main body 120 of printed wiring board 110 shown in FIG. 21(B) is separated when bridge portions 122 formed between slits 124 have been cut out. Support pieces (112H) of printed wiring board 110 remain in the connected metal frame (130G). In the second embodiment, slits 124 are formed in advance to make it easier to separate main body 120 of printed wiring board 110.

Third Embodiment

Figure 22:
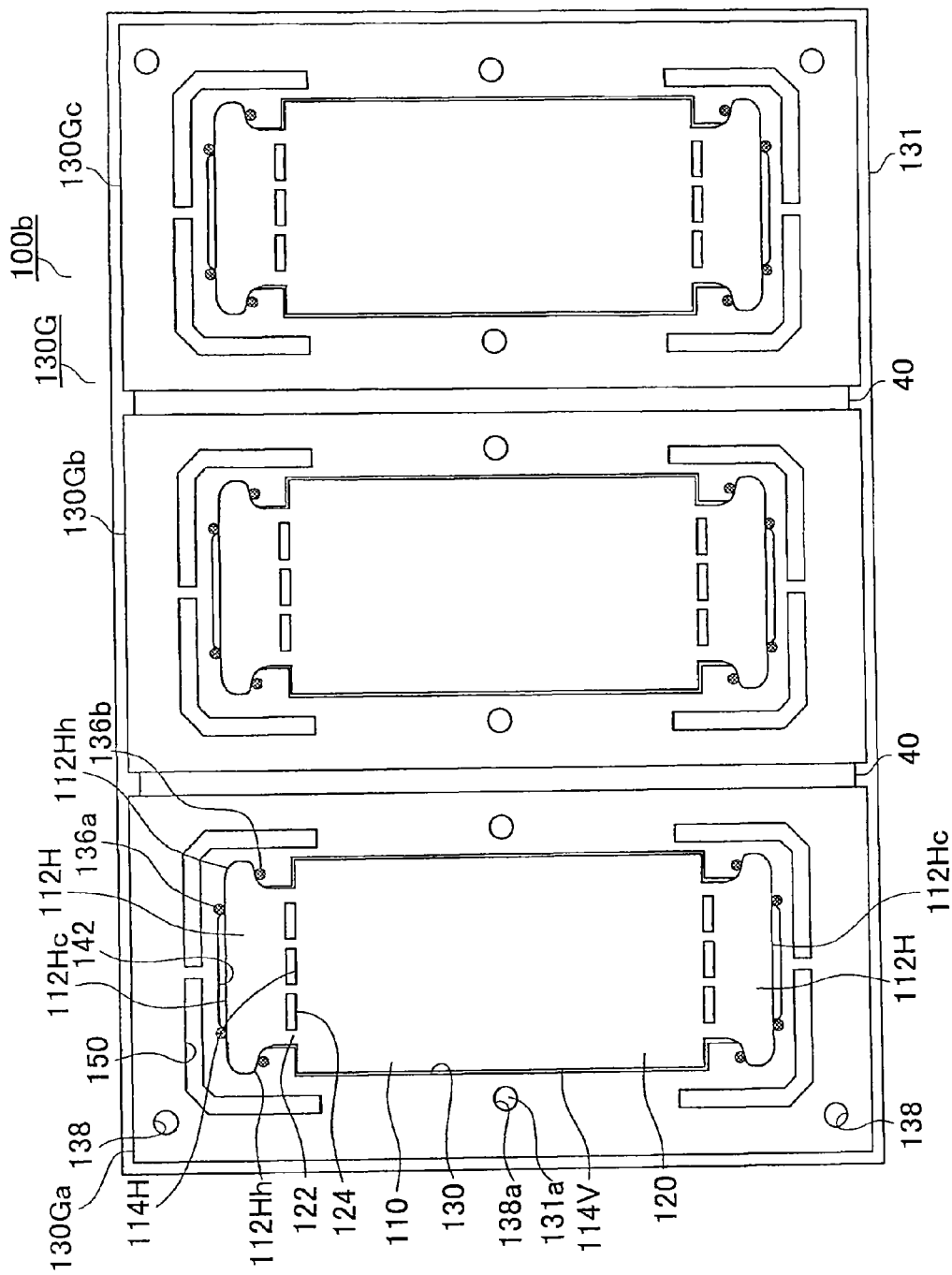
FIG. 22 is a plan view of a combined wiring board according to a third embodiment.

FIG. 22 shows combined wiring board (100b) according to a third embodiment.

In combined wiring board (100b), multiple printed wiring boards 110 to be reflowed are fixed to connected metal frame (130G). Connected metal frame (130G) is made up of three aluminum metal frames (130Ga~130Gc) and pin sheet 131 for aligning and connecting metal frames (130Ga~130Gc). Metal frames (130Ga~130Gc), which are aligned to pin sheet 131 when pin (131a) is inserted into pin insertion hole (138a) formed in each of metal frames (130Ga~130Gc), are connected to each other by adhesive agent 40.

Printed wiring board 110 is fixed by crimped portions (136a, 136b) to each accommodation opening 130 of metal frames (130Ga~130Gc). In each of metal frames (130Ga~130Gc), four L-shaped slits 150 are formed to surround the four corners of opening 130.

Figure 23:
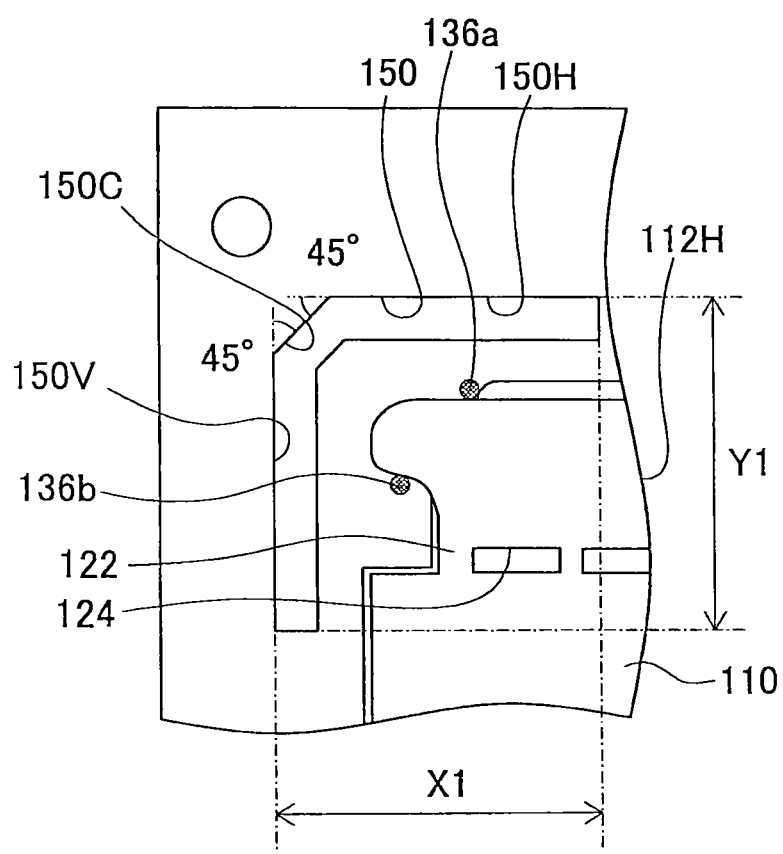
FIG. 23 is an enlarged view of an L-shaped slit in FIG. 22.

FIG. 23 is an enlarged view of L-shaped slit 150. L-shaped slit 150 has first straight portion (150H) formed along a long side of connected metal frame (130G) (the direction in which metal frames (130Ga~130Gc) are arrayed), second straight portion (150V) formed along a short side of connected metal frame (130G) to be perpendicular to the first straight portion (150H), and third straight portion (150C) positioned between first straight portion (150H) and second straight portion (150B). The angle made by third straight portion (150C) and a line extended from first straight portion (150H) is approximately 45 degrees, and the angle made by third straight portion (150C) and a line extended from second straight portion (150V) is approximately 45 degrees. Length (X1) (length of L-shaped slit in a direction of X), obtained by adding the length of first straight portion (150H) and the length of a component of third straight portion (150C) extended in a direction along the first straight portion, is 18 mm. Length (Y1) (length of L-shaped slit in a direction of Y), obtained by adding the length of second straight portion (150V) and the length of a component of third straight portion (150C) extended in a direction along the second straight portion, is 18 mm. The length of first straight portion (150H) is equal to the length of second straight portion (150V).

The thicknesses of connected metal frame (130G) and printed wiring board 110 are respectively the same as those of connected metal frame (30G) and printed wiring board 10. The central plane of connected metal frame (130G) in a thickness direction corresponds to the central plane of printed wiring board 110 in the thickness direction. Thus, connected metal frame (130G) is recessed from upper surface (first surface) (F) of printed wiring board 110, and connected metal frame (130G) is recessed from lower surface (second surface) (S) of printed wiring board 110. The coefficient of thermal expansion along a main surface of connected metal frame (130G) made of aluminum is 23 ppm/° C., and the coefficient of thermal expansion along a main surface of printed wiring board 110 made of resin is 16 ppm/° C.

The same as in the second embodiment, printed wiring board 110 has one support piece (112H) formed on each short-side sidewall (114H) of rectangular main body 120 to face each other and sandwich main body 120 as shown in FIG. 22. Main body 120 and support piece (112H) are connected by bridge portions 122 made of slits 124.

In support piece (112H) of printed wiring board 110 in the third embodiment, a pair of extension tabs (112Hh) to increase the width in substantially a U-shape is provided on both sides, and crimped portions (136*a*, 136*b*) are formed at the base of each extension tab (112Hh). Crimped portions (136*a*, 136*b*) cause the sidewall of accommodation opening 130 to make contact with and be pushed against the sidewall of extension tab (112Hh). Except for the portions of extension tab (112Hh) fixed by crimped portions (136*a*, 136*b*), the sidewall of printed wiring board 110 is not in contact with the sidewall of accommodation opening 130. Moreover, recess 142 is provided for accommodation opening 130 along straight portion (112Hc) between crimped portions (136*a*) so as to avoid interference. Accordingly, stress is prevented from being exerted on straight portion (112Hc) when printed wiring board 110 undergoes thermal contraction. For the same reasons, clearance is provided between long-side sidewall (114V) of main body 120 and accommodation opening 130. Stress along a long side of printed wiring board 110 is exerted on crimped portion (136*a*) formed at an end of straight portion (112Hc) of support piece (112H). However, in the direction of such stress, L-shaped slit 150 is formed on the line extended from the long side of printed wiring board 110. Meanwhile, stress along a short side of printed wiring board 110 is also exerted on crimped portion (136*a*). However, in the direction of such stress, L-shaped slit 150 is formed on the line extended from the short side of printed wiring board 110. Accordingly, stress is uniformly mitigated in the printed wiring board during a reflow process, and warping is less likely to occur in printed wiring board 110.

In the above first embodiment, the connected metal frame is formed with four metal frames connected to each other. However, the metal frame may be formed by connecting two, three or five or more metal frames. Also, in the second and third embodiments, two or four or more metal frames may also be connected to form a connected metal frame instead of using three metal frames. In addition, in each of the aforementioned embodiments, the frame section made of connected metal frame (30G), (130G) or the like is preferred to have higher rigidity at a solder reflow temperature than the piece section made of printed wiring boards 10 and the like.

In a process for mounting an electronic component on a wiring board, the reflow temperature of solder exceeds the glass transition temperature (Tg) of the material used in the wiring board. Accordingly, due to the weight of the mounted electronic component and the residual stress in the wiring board, warping may occur in the wiring board.

A combined wiring board according to an embodiment of the present invention prevents a printed wiring board from warping in a reflow process for mounting an electronic component.

A combined wiring board according to an embodiment of the present invention has multiple wiring boards and multiple metal frames each having an opening to accommodate an individual wiring board. The metal frames are connected to each other by a connecting portion.

In a combined wiring board according to an embodiment of the present invention, since wiring boards are each accommodated to be fixed in an individual metal frame, warping is less likely to occur in the wiring boards. Especially, such a structure of metal frames connected to each other by connecting portions reduces variations in warping caused by positional differences among wiring boards in the combined wiring board (for example, a position at an edge or in the center). Thus, compared with a structure where multiple wiring boards are accommodated in a metal frame to be fixed to the frame, differences in the effects of warping reduction are smaller. Moreover, it is easy to adjust the number of wiring boards in a combined wiring board by changing the number of connected metal frames. Accordingly, efficiency improves when mounting components on wiring boards.

Obviously, numerous modifications and variations of the present invention are possible in light of the above teachings. It is therefore to be understood that within the scope of the appended claims, the invention may be practiced otherwise than as specifically described herein.

What is claimed is:

1. a combined wiring board, comprising: a plurality of wiring boards; and a connected metal frame comprising a plurality of metal frames and at least one connecting portion such that the plurality of metal frames is connected each other by the connecting portion and has a plurality of accommodation opening portions configured to accommodate the wiring boards, respectively, wherein each of the metal frames has a coefficient of thermal expansion which is higher than a coefficient of thermal expansion of each of the wiring boards with respect to a direction of main surfaces of the metal frames and a direction of main surfaces of the wiring boards.

2. A combined wiring board according to claim 1, wherein the connecting portion comprises an adhesive agent.

3. A combined wiring board according to claim 2, wherein each of the metal frames has a plurality of crimped portions plastically deformed such that wall portions of each of the metal frames in the accommodation opening portions are in contact with side wall portions of the wiring boards to fix the wiring boards in the accommodation opening portions of the metal frames, respectively.

4. A combined wiring board according to claim 2, wherein each of the metal frames has a plurality of slit portions formed in the accommodation opening portion, and each of the wiring boards has a plurality of support piece portions configured to engage with the plurality of slit portions, respectively.

5. A combined wiring board according to claim 1, wherein each of the metal frames has a plurality of crimped portions plastically deformed such that wall portions of each of the metal frames in the accommodation opening portions are in contact with side wall portions of the wiring boards to fix the wiring boards in the accommodation opening portions of the metal frames, respectively.

6. A combined wiring board according to claim 5, wherein each of the metal frames has a plurality of slit portions formed in the accommodation opening portion, and each of the wiring boards has a plurality of support piece portions configured to engage with the plurality of slit portions, respectively.

7. A combined wiring board according to claim 5, wherein each of the metal frames has a plurality of slit portions formed in the accommodation opening portion, each of the wiring boards has a plurality of support piece portions configured to engage with the plurality of slit portions, respectively, and the plurality of crimped portions are formed adjacent to the plurality of slit portions.

8. A combined wiring board according to claim 5, wherein each of the metal frames has a plurality of slit portions formed in the accommodation opening portion, and each of the wiring boards has a plurality of support piece portions configured to engage with the plurality of slit portions, respectively.

9. A combined wiring board according to claim 1, wherein the plurality of metal frames has a plurality of coupling portions configured to engage each other such that the metal frames are connected each other.

10. A combined wiring board according to claim 1, wherein each of the metal frames has a thickness which is less than a thickness of each of the wiring boards.

11. A combined wiring board according to claim 10, wherein each of the metal frames has a plurality of crimped portions plastically deformed such that wall portions of each of the metal frames in the accommodation opening portions are in contact with side wall portions of the wiring boards to fix the wiring boards in the accommodation opening portions of the metal frames, respectively.

12. A combined wiring board according to claim 10, wherein each of the metal frames has a plurality of slit portions formed in the accommodation portion, and each of the wiring boards has a plurality of support piece portions configured to engage with the plurality of slit portions, respectively.

13. A combined wiring board according to claim 1, wherein the accommodation opening portion of each of the metal frames is configured such that a clearance is formed between the metal frame and the wiring board accommodated in the accommodation opening portion of the metal frame.

14. A combined wiring board according to claim 1, wherein each of the metal frames has a plurality of alignment holes.

* * * * *